(12) United States Patent
Liff et al.

(10) Patent No.: US 11,183,477 B2
(45) Date of Patent: Nov. 23, 2021

(54) MIXED HYBRID BONDING STRUCTURES AND METHODS OF FORMING THE SAME

(71) Applicant: Intel Corporation, Santa Clara, CA (US)

(72) Inventors: Shawna Liff, Scottsdale, AZ (US); Adel Elsherbini, Tempe, AZ (US); Johanna Swan, Scottsdale, AZ (US); Nagatoshi Tsunoda, Chandler, AZ (US); Jimin Yao, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 102 days.

(21) Appl. No.: 16/584,522

(22) Filed: Sep. 26, 2019

(65) Prior Publication Data

US 2021/0098411 A1   Apr. 1, 2021

(51) Int. Cl.
*H01L 23/498* (2006.01)
*H01L 23/00* (2006.01)
*H01L 21/48* (2006.01)

(52) U.S. Cl.
CPC .......... *H01L 24/32* (2013.01); *H01L 21/4853* (2013.01); *H01L 23/49811* (2013.01); *H01L 24/08* (2013.01); *H01L 24/16* (2013.01); *H01L 24/27* (2013.01); *H01L 24/29* (2013.01); *H01L 24/73* (2013.01); *H01L 24/81* (2013.01); *H01L 24/83* (2013.01); *H01L 24/92* (2013.01); *H01L 2224/08167* (2013.01); *H01L 2224/16237* (2013.01); *H01L 2224/29082* (2013.01); *H01L 2224/29187* (2013.01); *H01L 2224/29386* (2013.01); *H01L 2224/32237* (2013.01);

(Continued)

(58) Field of Classification Search
CPC . H01L 2224/08167; H01L 2224/16237; H01L 23/49811; H01L 24/08; H01L 24/16; H01L 24/27; H01L 24/29; H01L 24/32; H01L 24/73; H01L 24/81; H01L 24/83; H01L 24/92
USPC .......................................................... 257/668
See application file for complete search history.

(56) References Cited

U.S. PATENT DOCUMENTS

2011/0095403 A1* 4/2011 Lee ................... H01L 21/76898
257/660
2015/0294896 A1* 10/2015 Hurwitz ................ H01L 25/072
438/15

(Continued)

OTHER PUBLICATIONS

Kim, H. et al., "350*C processable low-CTE transparent glass-fabric-reinforced hybrimerfilm for flexible substrates", Journal of Information Display, vol. 16, No. 1, pp. 57-64, 2015.

*Primary Examiner* — Long K Tran
(74) *Attorney, Agent, or Firm* — Essential Patents Group, LLP.

(57) ABSTRACT

Embodiments include a mixed hybrid bonding structure comprising a composite dielectric layer, where the composite dielectric layer comprises an organic dielectric material having a plurality of inorganic filler material. One or more conductive substrate interconnect structures are within the composite dielectric layer. A die is on the composite dielectric layer, the die having one or more conductive die interconnect structures within a die dielectric material. The one or more conductive die interconnect structures are directly bonded to the one or more conductive substrate interconnect structures, and the inorganic filler material of the composite dielectric layer is bonded to the die dielectric material.

15 Claims, 22 Drawing Sheets

(52) U.S. Cl.
CPC .............. *H01L 2224/73204* (2013.01); *H01L 2224/80895* (2013.01); *H01L 2224/80896* (2013.01); *H01L 2224/81895* (2013.01); *H01L 2224/81896* (2013.01); *H01L 2224/83895* (2013.01); *H01L 2224/83896* (2013.01); *H01L 2224/9211* (2013.01)

(56) References Cited

U.S. PATENT DOCUMENTS

2018/0114749 A1\* 4/2018 Dimaano, Jr. ........ H01L 21/565
2020/0006251 A1\* 1/2020 Chen ................... H01L 23/5385

\* cited by examiner

MIXED HYBRID BONDING STRUCTURES AND METHODS OF FORMING THE SAME

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. Mobile products, such as cell phones, for example, often have microelectronic packages with small form factors which can pose many thermal challenges. Due to increasingly shrinking dimensions of conductive traces, and the continually increasing complexity and power density of logic within devices, pitch scaling between conductive interconnect structures, such as between die interconnect structures, for example, can become a challenge during manufacturing processes, which frequently require thermal processing steps.

Pitch scaling in die to organic package interconnection can be limited by coefficient of thermal expansion (CTE) mismatch between organic substrates and interconnect materials, as well as by the use of solder microbumps. For example, the CTE mismatch between conductive interconnect materials coupled with an organic substrate (which can be much greater than a CTE of silicon) may cause reliability issues such as bump misalignment, bump stress and/or cracks. Additionally, as die become larger, assembly of solder micro bumps located near the die periphery becomes more challenging due to expansion of the organic substrate at temperatures necessary to achieve solder reflow of the solder microbumps.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
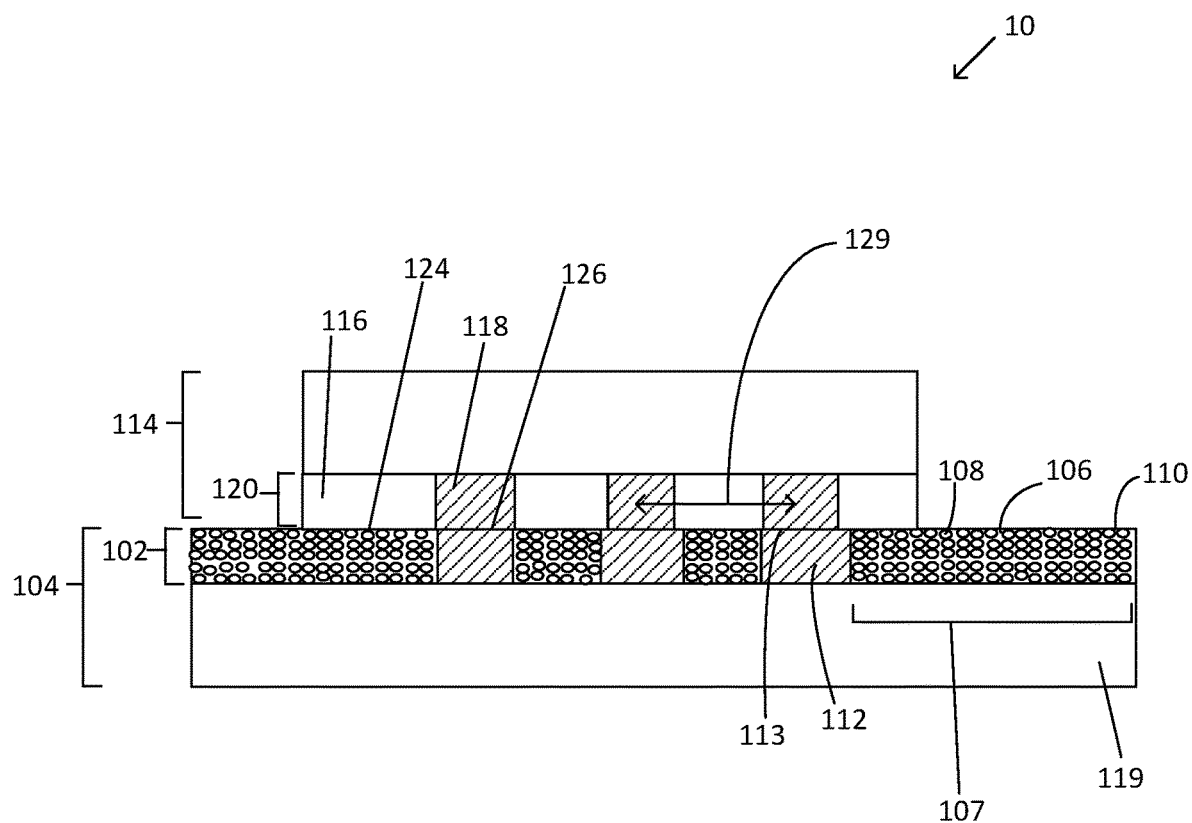
FIGS. 1A-1E illustrate cross-sectional views of mixed hybrid bonding structures, according to embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized, and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/−10 percent of a target value.

Various implementations of the embodiments herein may be formed or carried out on a substrate, such as a package substrate. In some embodiments, a package substrate may comprise any suitable type of substrate capable of providing electrical communications between an electrical component, such as an integrated circuit (IC) die, and a next-level component to which an IC package may be coupled (such as a circuit board, for example). In other embodiments, the substrate may comprise any suitable type of substrate capable of providing electrical communication between an IC die and an upper IC package coupled with a lower IC/die package, and in some embodiments, a substrate may comprise any suitable type of substrate capable of providing electrical communication between an upper IC package and a next-level component to which an IC package is coupled.

A substrate may also provide structural support for a device, such as a die. By way of example, in some embodiments, a substrate may comprise a multi-layer substrate—including alternating layers of a dielectric material and metal—built-up around a core layer (either a dielectric or a metal core), and may include through via structures that extend through the core. In other embodiments, a substrate may comprise a coreless multi-layer substrate, in which case through via structures may be absent. Other types of substrates and substrate materials may also find use with the disclosed embodiments (e.g., ceramics, sapphire, glass, etc.). Further, according to some embodiments, a substrate may comprise alternating layers of dielectric material and metal that are built-up over a die itself—this process is sometimes referred to as a "bump-less build-up process." Where such an approach is utilized, conductive interconnects may or may not be needed (as the build-up layers may be disposed directly over a die/device, in some cases).

A die may include a front-side and an opposing back-side, and may be an integrated circuit die and/or an integrated circuit device, in some embodiments. In some embodiments, one or both of the front-side or the back-side of a die may be referred to as the "active surface" of the die. A number of interconnects may extend from the die's front-side and/or back-side to an underlying substrate and/or and overlaying substrate respectively, and these interconnects may electrically couple the die and one or more substrates. In some cases a die may be directly coupled to a board, such as a motherboard. Interconnects/traces may comprise any type of structure and materials capable of providing electrical communication between a die and substrate/board. In some embodiments, a die may be disposed on a substrate in a flip-chip arrangement. In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be on the terminals of a substrate and/or die, and these terminals may then be joined using a solder reflow process, for example. Of course, it should be understood that many other types of interconnects and materials are possible (e.g., wirebonds extending between a die and a substrate). In some embodiments herein, a die may be coupled with a substrate by a number of interconnects in a flip-chip arrangement. However, in other embodiments, alternative structures and/or methods may be utilized to couple a die with a substrate, where solder may not be used, as will be further described herein.

Described herein are embodiments of microelectronic package structures having mixed hybrid bonding interfaces. In an embodiment, a composite organic dielectric layer may be on a substrate, such as a low CTE carrier substrate, for example. The composite organic dielectric layer may comprise an organic dielectric layer filled with an inorganic filler material, such as silica, for example. One or more conductive substrate interconnect structures may be disposed within the composite organic dielectric layer. A die may be on the composite organic dielectric layer, the die having one or more conductive die interconnect structures within a die dielectric material/layer. The one or more conductive die interconnect structures are directly bonded to the one or more conductive substrate interconnect structures, and the inorganic filler material of the composite organic dielectric material is directly bonded (e.g., covalently) to the die dielectric material, wherein the covalent bonding occurs after subsequent temperature processing of the microelectronic package structure. The metal to metal bonding of the conductive interconnect structures (which takes place after the dielectric covalent bonding is created) is accomplished without the use of solder or underfill materials. The composite organic dielectric layer comprises a CTE, in a direction normal to the bonding interface, that is substantially lower than a CTE of the conductive interconnect structures of the die and substrate. Pitch scaling between die interconnect structures is enabled for pitches well below 50 microns.

The composite organic dielectric layer may have a CTE, in a direction normal to the bonding interface plane, that is substantially lower than a CTE of the conductive interconnect structures of the die and substrate. The CTE of the composite organic dielectric layer in the in-plane direction may be optimized to reduce the CTE mismatch between the die and the substrate. By decreasing the CTE mismatch, yield and reliability are improved and the pitch of the interconnects may be reduced. Direct metal to metal bonding of the conductive substrate interconnect structures to the conductive die interconnect structures is enabled, without the use of solder or underfill materials after the dielectric bonds between the two interface surfaces are formed. Pitch scaling between die interconnect structures is enabled for pitches below 50 microns.

FIG. 1A is a cross-sectional view of a portion of a mixed hybrid bonding structure 10, arranged in accordance with some embodiments of the present disclosure. The mixed hybrid bonding structure 10 comprises a substrate 104 and a die 114. The die 114, which may comprise any suitable type of die/device may include any number of circuit elements, such as any type of transistor elements and/or passive elements. The die 114 may comprise N-type and/or P-type transistors, which may include materials such as silicon, germanium, indium, antimonide, lead telluride, indium arsenide, indium phosphide, gallium arsenide, or gallium antimonide, for example. The die may include such structures as planar transistors and/or nonplanar transistors, FinFET transistors, nanowire transistors and/or nanoribbon transistors.

The die 114 may comprise a die bonding layer 120. The die bonding layer may comprise an inorganic dielectric material 116 with conductive die interconnect structures disposed 118 therein, in an embodiment. The inorganic dielectric material 116 may comprise any suitable inorganic dielectric material, such as inorganic dielectric materials comprising silicon, nitrogen, carbon or oxygen, and combinations thereof, for example. One or more conductive die interconnect structures 118 may be within the inorganic dielectric layer 116. The one or more conductive die interconnect structures 118 may comprise any suitable conductive material, such as copper, ruthenium, titanium, tantalum, or cobalt, for example, and combinations thereof. Individual ones of the one or more conductive die interconnect structures 118 may comprise a surface 126. In an embodiment, the surface 126 may be slightly recessed below surface 124 of the dielectric material 116 of the die bonding layer 120. For example, the surface 126 may be about 1 nm to about 10 nm below the surface 124 of the die dielectric material 116, in some cases.

The one or more conductive die interconnect structures 118 are separated from each other by the inorganic dielectric material 116. In an embodiment, a pitch 129 between adjacent individual ones of the conductive die interconnect structures 118 may comprise about 50 microns or below. In other embodiments, the pitch 129 may be greater than 50 microns, depending upon the particular application. The substrate 104 may comprise a substrate bonding layer 102 that is on a platform 119. The platform 119 may comprise any suitable platform, such as a carrier or a handle wafer, and may comprise such materials as silicon, a glass material, III-V materials, or multi-layer organic materials on a low CTE carrier. The substrate bonding layer 102 of the substrate 104 may comprise a composite organic dielectric layer 107 and one or more conductive substrate interconnect structures 112. The one or more conductive substrate interconnect structures 112 may comprise any suitable conductive material, such as copper, ruthenium, titanium, tantalum, or cobalt, for example, and combinations thereof. Individual ones of the one or more conductive substrate interconnect structures 112 may comprise a top surface 113.

A composite dielectric layer 107 (which has a top surface 110) comprises a plurality of inorganic filler material/particles 108 that are disposed within an organic dielectric material/layer 106. The organic dielectric material 106 may comprise such materials as mold compounds, epoxy resin systems such as build up materials, aromatic polymers, polyimides, perflourocyclobutane (PFCB) materials, benzocyclobutene (BCB) materials, or combinations thereof. In other embodiments, the organic dielectric material 106 may comprise spin on glass or sol-gel systems with low CTE filler material.

In an embodiment, the inorganic filler materials 108 may comprise silica materials, such as silica particles, low CTE dielectric fibers, dielectric particles, or platelets, silicon nitride, silicon dioxide, silicon carbide, silicon carbide nitride, aluminum oxide, diamond particles (such as CVD diamond particles), or combinations thereof. In an embodiment, the composite dielectric layer 107 may comprise between about 70 to about 95 percent by weight of the inorganic filler material 108. The percentage by weight of the inorganic filler material 108 can be optimized to produce a low CTE of the composite dielectric layer 107 of the substrate bonding layer 102. In an embodiment, the CTE of the composite dielectric layer 107 may comprise between about 0.5 ppm per degrees Celsius to about 10 ppm per degrees Celsius. The CTE of the composite dielectric layer 107 is optimized to be significantly smaller than the CTE of the conductive interconnects 112, 118 in the bonding direction (out of plane). Furthermore, the in-plane CTE mismatch between the die 114 and the substrate 104 is minimized, in some cases by the use of a low CTE carrier substrate 119, to enable smaller conductive interconnect bonding layer pitch 129. In an embodiment, the CTE of the conductive interconnects 118, 112 is greater than about 30 percent of the CTE of the composite organic dielectric layer 107 in the bonding direction. The die bonding layer 120 is directly on and electrically coupled to the substrate bonding layer 102.

Figure 1B:
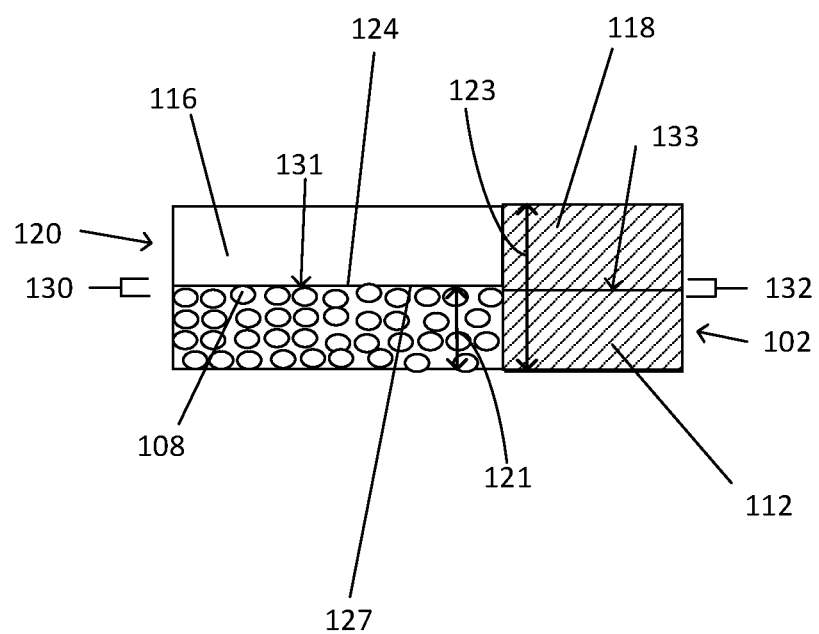

In FIG. 1B (depicting a cross-sectional portion of the interface between the die bonding layer 120 and the substrate bonding layer 102), a covalent bonding region 130 is disposed between the top surface 124 of the inorganic dielectric material 116 of the die bonding layer 120 and the top surface 110 of the substrate bonding layer 102. In an embodiment, one or more of the plurality of inorganic filler material 108 of the substrate bonding layer 102 may form inorganic covalent bonds 131 with the inorganic dielectric material 116 of the die bonding layer 120. Additionally, the conductive die interconnect structures 118 and the conductive substrate interconnect structures 112 form direct metallic bonds 133 with each other in a metallic bond region 132. Thus, by utilizing a mixed hybrid bonding process according to the embodiments described herein, wherein the substrate and die are bonded together using both metallic bonds 133 and inorganic dielectric bonds 131, bonding may occur without the use of solder materials at die to organic interfaces. There is an absence of underfill materials and an absence of seed layer plating materials on the conductive die and substrate interconnect structures (as well as between the die bonding layer 120 and substrate bonding layer 120 interface 127), since plating, solder and underfill materials are not necessary to bond the conductive interconnect structures to each other. The composite dielectric layer 107 comprises a CTE 121, in a direction normal to the plane of the bonding interface 127, that is substantially lower than a CTE 123 (in a direction normal to the plane of the bonding interface 127) of the conductive interconnect structures of the die and the substrate.

Figure 1C:
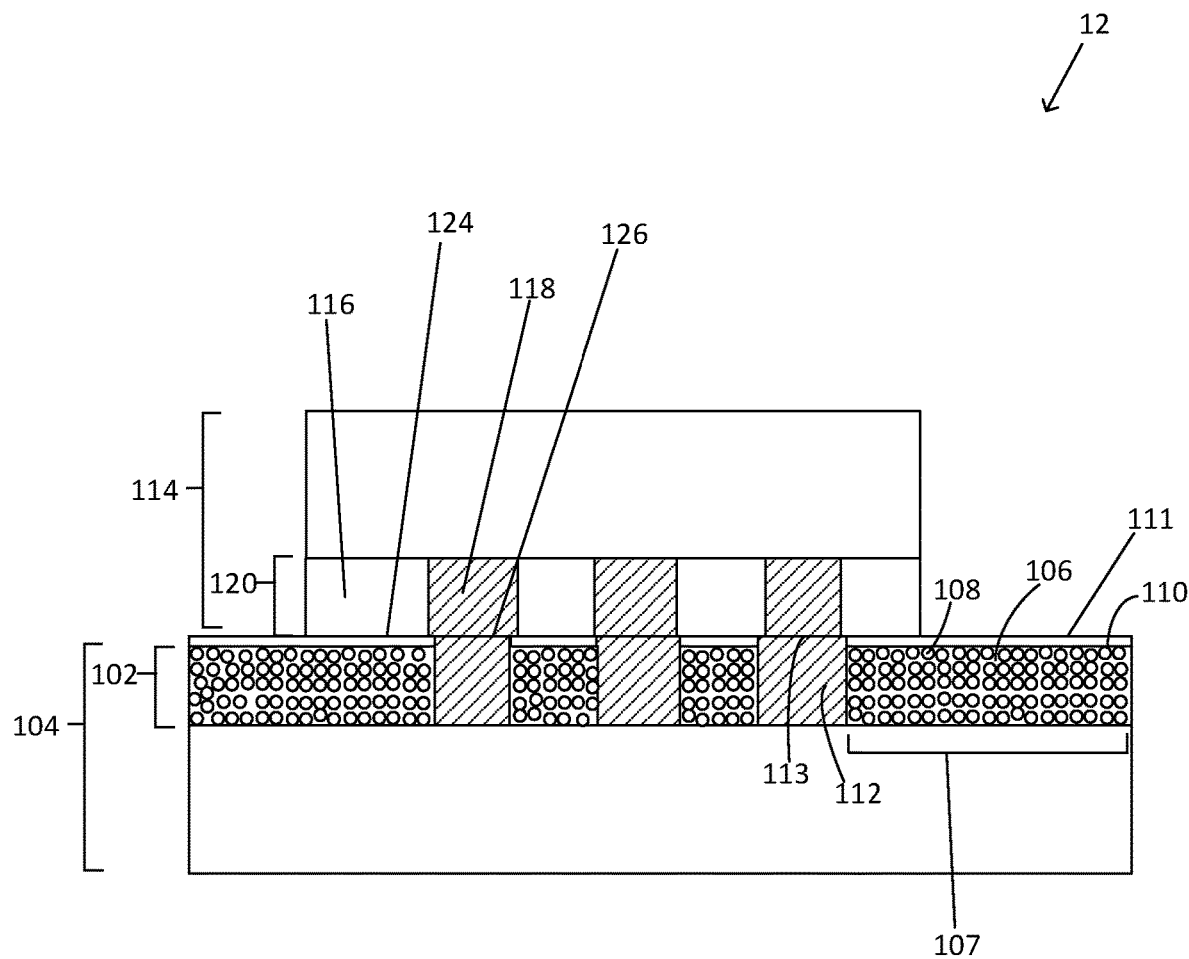

In FIG. 1C, a cross-sectional view of a portion of a mixed hybrid bonding structure 12 is depicted in accordance with some embodiments of the present disclosure. The mixed hybrid bonding structure 12 comprises a substrate 104 and a die 114. The die 114 comprises a die bonding layer 120 comprising an inorganic dielectric material 116, wherein or more conductive die interconnect structures 118 are disposed within the inorganic dielectric layer 116. The one or more conductive die interconnect structures 118 comprise a top surface 126, wherein the top surfaces 126 may be directly on the top surfaces 113 of the conductive substrate interconnect structures 112.

In an embodiment, a coating layer 111, which may comprise an inorganic layer 111, may be on the surface of the composite dielectric layer 107 (which is similar to the composite dielectric material of FIG. 1A, for example). The inorganic layer 111 may comprise a thickness of between about 10 nm to about 1600 nm, in an embodiment. The coating layer 111 may comprise such materials as silicon, oxygen, nitrogen, or carbon, and combinations thereof, in an embodiment. The coating layer 111 may comprise a such materials as a physical vapor deposition (PVD) material, an atomic layer deposition (ALD) material, a chemical vapor deposition (CVD) and in some instances include pulsed laser annealing, or a spin on dielectric material. The coating layer 111 may be directly on the organic dielectric material 106, which includes the inorganic filler material 108, such that particles of the inorganic filler material 108 may be in direct contact with the coating layer 111, and may be covalently bonded to the coating layer 111.

In an embodiment, the coating layer 111 is on the organic dielectric material 106, but is not on the top surfaces 113 of the conductive substrate interconnect structures 112, and is on a portion of the sidewalls of the conductive substrate interconnect structures 112. The coating layer 111 is on the top surface of the die bonding layer 120. The inorganic layer 111 is covalently bonded to the inorganic dielectric material 116, and the die interconnect structures 118 are directly bonded to the substrate interconnect structures 112, without the use of solder or underfill materials. The CTE of the composite dielectric layer 107 including the plurality of inorganic filler material 108, is less than the CTE of the conductive interconnect structures of the die and substrate 112, 118 in the direction normal to the bond-interface plane.

Figure 1D:
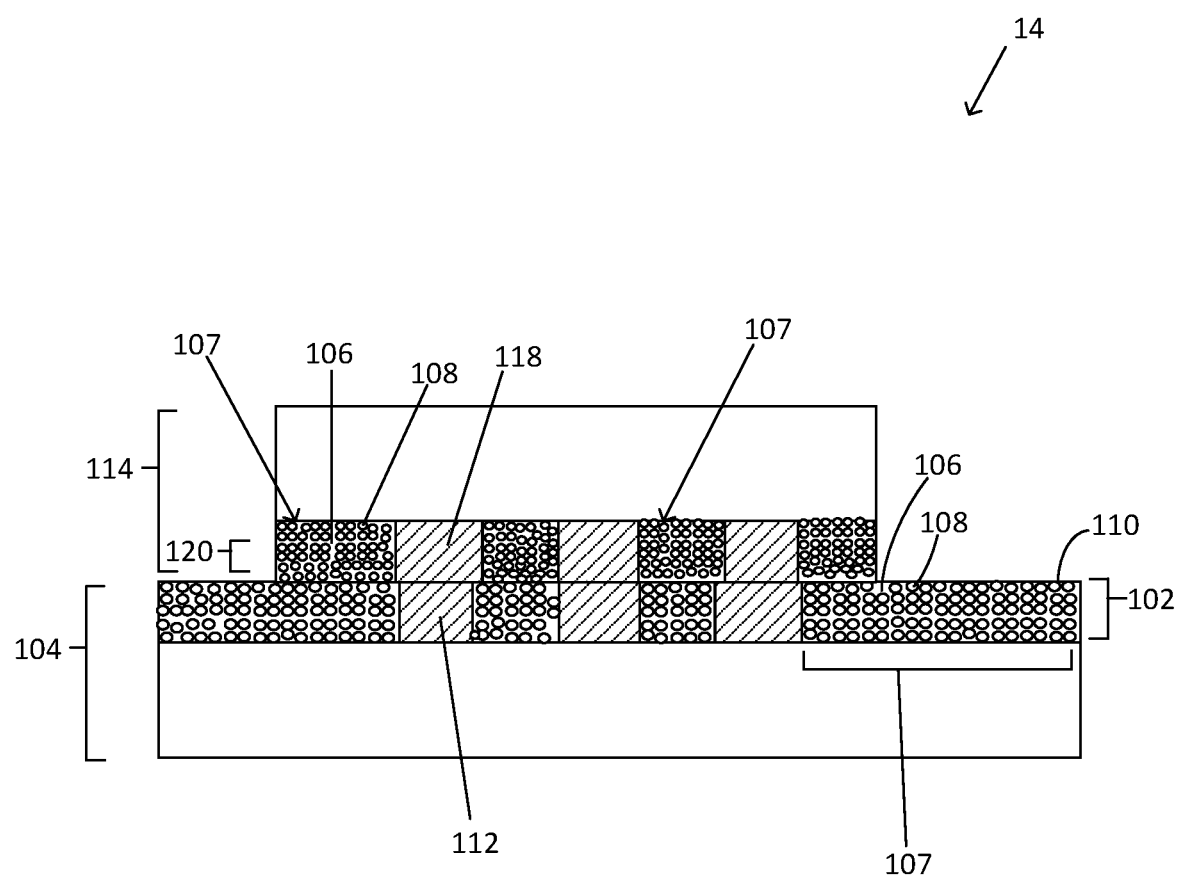

In FIG. 1D, a cross-sectional view of a portion of a hybrid bonding structure 14 is depicted in accordance with some embodiments of the present disclosure. The mixed hybrid bonding structure 14 comprises a substrate 104 and a die 114. The die 114 comprises a die bonding layer 120 comprising a composite dielectric layer 107, wherein a plurality of inorganic filler material 108 is disposed within an organic dielectric material 106. In an embodiment, the composite dielectric layer 107 of the die bonding layer 120 and the composite dielectric layer of the substrate bonding layer 102 may comprise between about 70 to about 95 percent by weight of the inorganic filler material 108. One or more conductive die interconnect structures 118 are within the composite dielectric layer 107 of the die bonding layer 120.

The one or more conductive die interconnect structures 118 are separated from each other by the composite dielectric layer 107. The substrate bonding layer 102 of the substrate 104 comprises the composite dielectric layer 107, wherein a plurality of inorganic filler material 108 is within the organic dielectric material 106. The composite dielectric layer 107 of the die bonding layer 120 is on the top surface 110 of the substrate bonding layer 102, wherein the inorganic filler material 108 of the die bonding layer 120 is covalently bonded to the inorganic filler material 108 of the substrate bonding layer 102, and the die interconnect structures 118 are directly bonded to the substrate interconnect structures 112, without the use of solder or underfill materials. The CTE of the composite dielectric layer 107 of the substrate bonding layer and the CTE of the composite dielectric layer 107 of the die bonding layer 120 are less than the CTE of the conductive interconnect structures of the die and substrate 112, 118 in the direction normal to the bond-interface plane.

In an embodiment, the composite dielectric layer 107 of the die bonding layer 120 may comprise substantially the same materials as the composite dielectric layer 107 of the substrate bonding layer, but in other embodiments, the materials may be different from each other. Thus, by utilizing a hybrid bonding process according to the embodiments described herein, wherein the substrate and die are bonded together using both metallic bonds and inorganic dielectric bonds, bonding may occur without the use of solder materials at die to organic interfaces. There is an absence of underfill materials, solder materials and an absence of seed layer plating materials at the die bonding layer 120 and substrate bonding layer 102 interface, since these materials are not necessary to bond the conductive interconnect structures to each other.

Figure 1E:
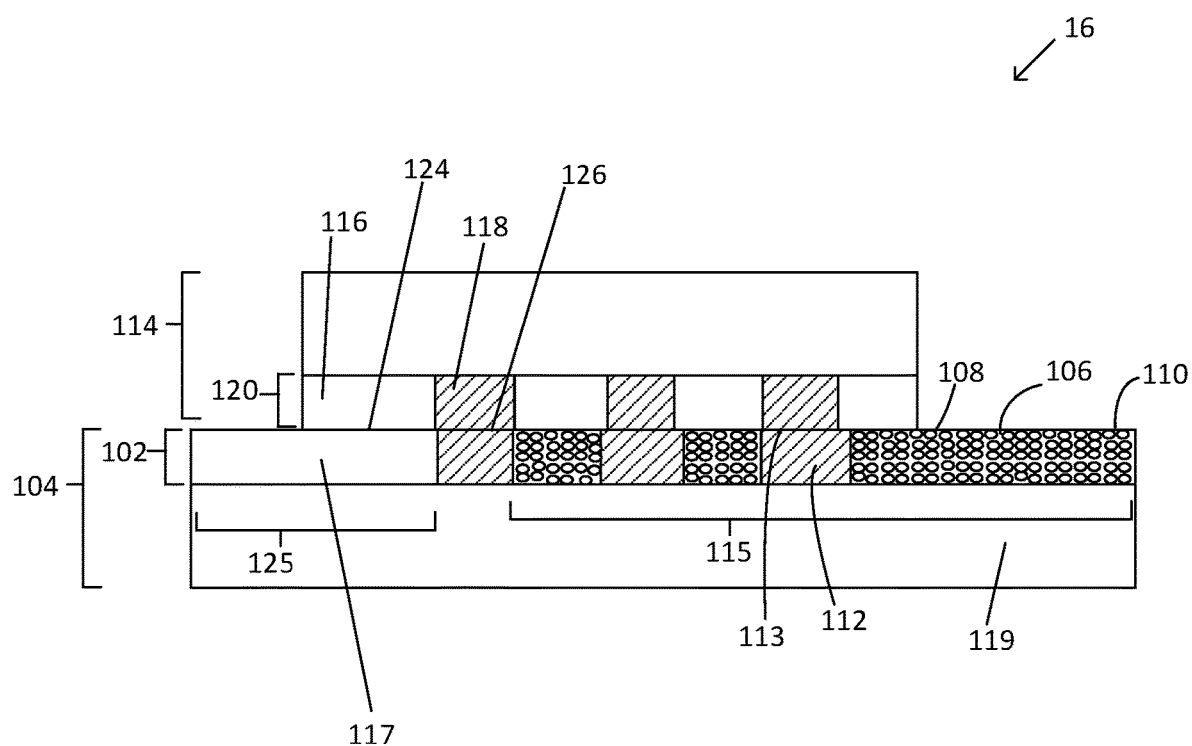

In FIG. 1E, a cross-sectional view of a portion of a mixed hybrid bonding structure 16 is depicted in accordance with some embodiments of the present disclosure. The mixed hybrid bonding structure 16 comprises a substrate 104 and a die 114. The die 114 comprises a die bonding layer 120 comprising an inorganic dielectric material 116. One or more conductive die interconnect structures 118 are disposed within the inorganic dielectric material 116. The one or more conductive die interconnect structures 118 may comprise a top surface 126.

The one or more conductive die interconnect structures 118 are separated from each other by the inorganic dielectric material 116. In an embodiment, the substrate bonding layer 102 of the substrate 104 comprises a first portion 115, wherein the first portion 115 comprises a composite dielectric material 107, wherein a plurality of inorganic filler material 108 is disposed within an organic dielectric material 106. A second portion 125 of the substrate bonding layer 102 comprises an inorganic dielectric material 117 that is free of the inorganic filler material 108. In an embodiment, the inorganic filler materials 108 of the first portion 115 of the substrate bonding layer 102 may comprise silica materials, such as silica particles, low CTE dielectric fibers, particles, or platelets, silicon nitride, silicon oxide, silicon carbide, silicon carbide nitride. In an embodiment, the composite dielectric layer 107 of the first portion 115 of the substrate bonding layer 102 may comprise between about 70 to about 95 percent by weight of inorganic filler materials. The CTE of the composite dielectric layer 107 of the first portion 115 of the substrate bonding layer 102 may be optimized according to a particular device/system design requirements.

The inorganic dielectric layer 116 of the die bonding layer 120 is on the top surface of the substrate bonding layer 102, wherein the inorganic dielectric material 116 of the die bonding layer 120 is covalently bonded to the inorganic filler material 108 of the first portion 115 of the substrate bonding layer 102, and the inorganic dielectric layer 116 of the die bonding layer 120 is also covalently bonded to the inorganic dielectric material 117 of the second portion 125 of the substrate bonding layer 102. The die interconnect structures 118 are directly bonded to the substrate interconnect structures 112, without the use of solder or underfill materials. The CTE of the composite dielectric layer 107 of the substrate bonding layer 102 is less than the CTE of the conductive interconnect structures of the die and substrate 112, 118 in the direction normal to the bonding interface plane. Additionally, the conductive die interconnect structures 118 and the conductive substrate interconnect structures 112 form direct metallic bonds to each other. There is an absence of underfill materials and an absence of seed layer plating materials on the conductive die and substrate interconnect structures (at the interfaces between top surfaces 126 and 113 of the die and substrate conductive interconnect structures 118, 112), since plating is not necessary to bond the conductive interconnect structures to each other.

Figure 1F:
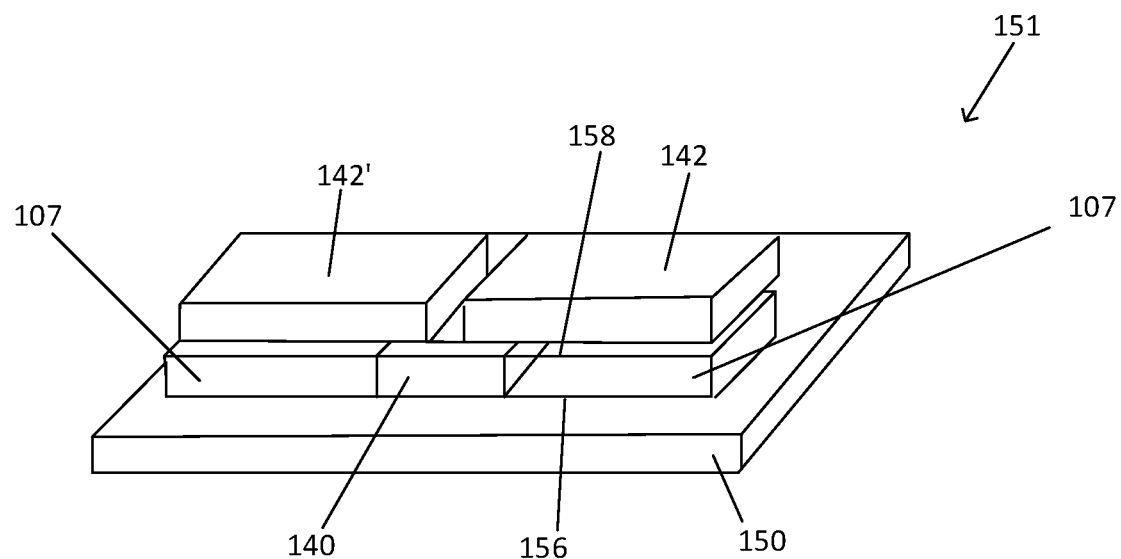
FIGS. 1F-1K illustrate cross-sectional and perspective views of portions of package structures comprising mixed hybrid bonding structures, according to embodiments.
Figure 1G:
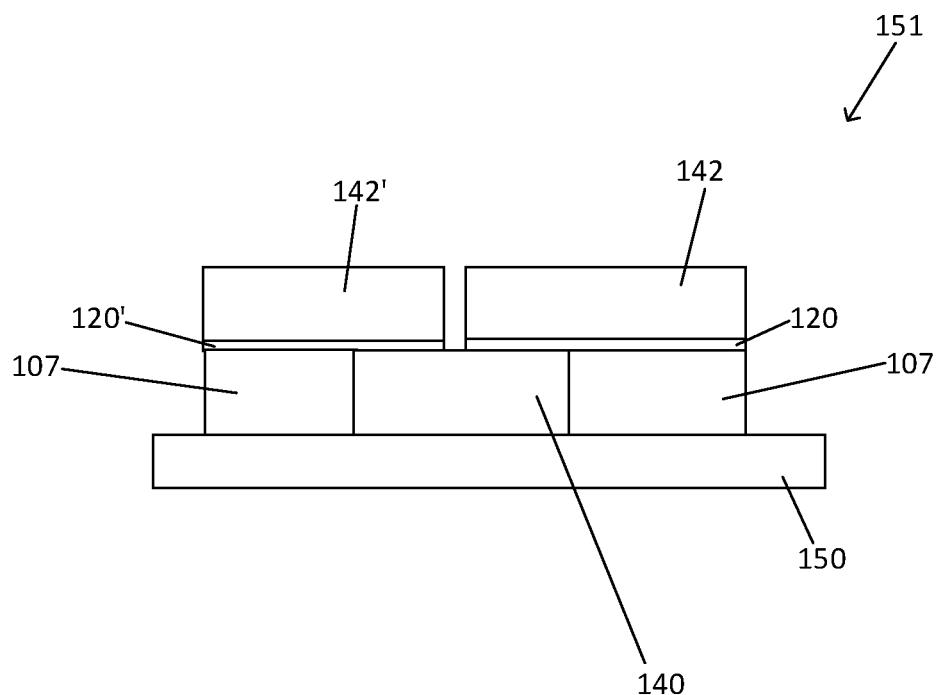

In FIG. 1F, a perspective view of a package structure 151 is depicted, according to an embodiment. A first die 140 is embedded within a composite dielectric layer or layers 107, wherein the first die 140 may be coupled, both electrically and physically, to interconnect structures (not shown) that are within the composite dielectric layer 107 This composite organic dielectric layer 107 is attached to a package substrate 150. A first side 156 of the composite layer 107 is on the package substrate 150. The composite dielectric layer 107 may comprise a die bonding layer on a second side 156, opposite side 158, according to any of the embodiments described herein. A second and third die 142, 142' are on the second side 158 of the composite dielectric layer 107, and are physically and electrically coupled to interconnect structures (not shown) within the composite dielectric layer 107. The second and third die 142, 142' may include die bonding layers 120, 120', wherein the die bonding layers 120,120' are on the second side 158 of the composite dielectric layer 107 (FIG. 1G, cross-sectional view). The die bonding layers 120,120' may encompass any of the embodiments of the die bonding layers 120 described herein. A dielectric layer of the die bonding layer 120 may be covalently bonded to an organic filler material (not shown) of the composite dielectric layer 107. Conductive interconnect structures (not shown, but encompassing any of the embodiments of the die bonding layers included herein) within the die bonding layers of the die 142, 142' and conductive interconnect structures within the composite dielectric layer 107 (not shown) are bonded together with metal bonding, as shown on FIG. 1B, for example.

Figure 1H:
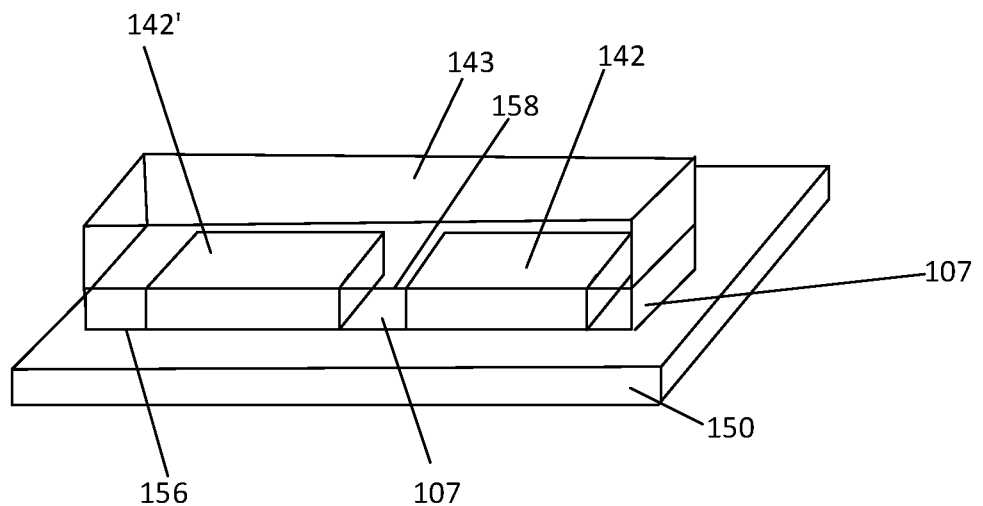
Figure 1I:
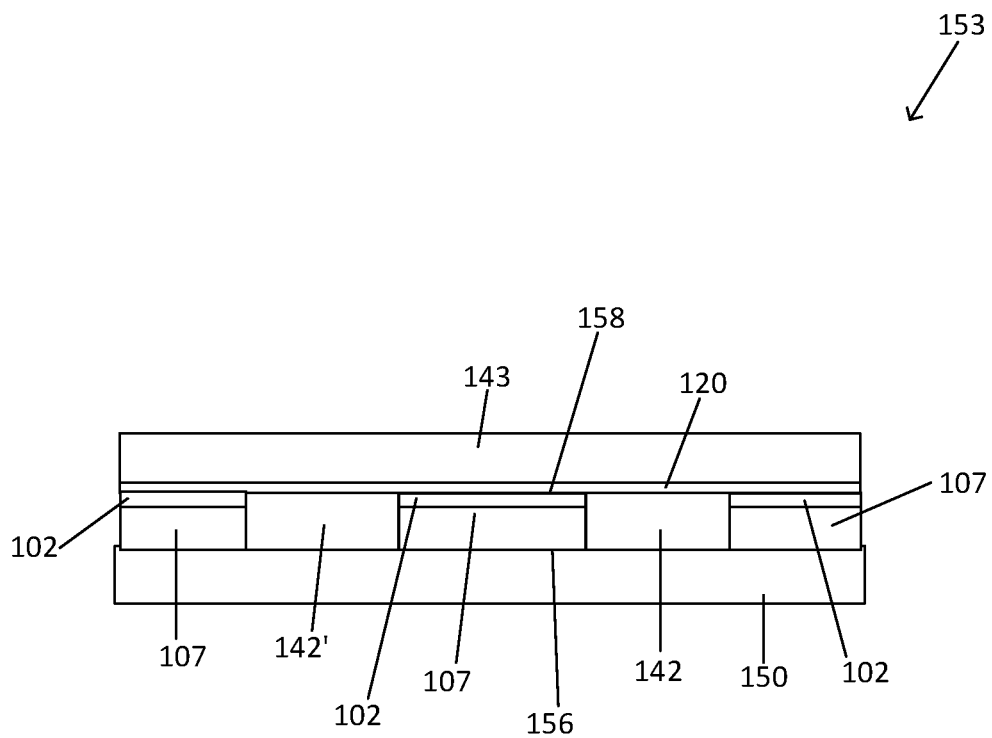

In FIG. 1H, a perspective view of a package structure 153 is depicted, according to an embodiment. A first side 156 of a composite dielectric layer 107 is physically and electrically coupled by interconnect structures (not shown) within the composite dielectric layer 107 to a package substrate 150. A first die 142 and a second die 142' are embedded within the composite dielectric layer 107, and may be adjacent to each other. The composite dielectric layer 107 may comprise a substrate bonding layer 102 according to any of the embodiments described herein. A third die 143 may comprise a die bonding layer 120 according to any of the embodiments herein, wherein the die bonding layer 120 is on the substrate bonding layer 102 of the organic composite layer 107 (FIG. 1I, cross-sectional view). Dielectric layers of the die bonding layer 120 may be covalently bonded to the inorganic filler material (not shown) of the composite dielectric layer 107. Conductive interconnect structures within the die bonding layer 120 and conductive substrate interconnect structures within the composite dielectric layer 107 are bonded together with dielectric and metal bonding, as shown in FIG. 1B, for example.

Figure 1J:
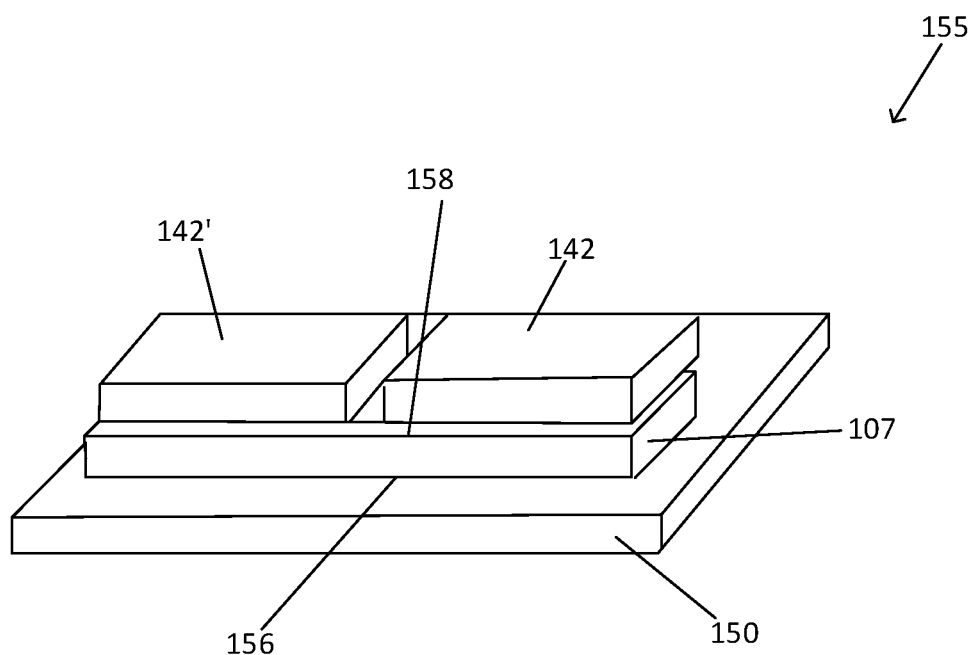
Figure 1K:
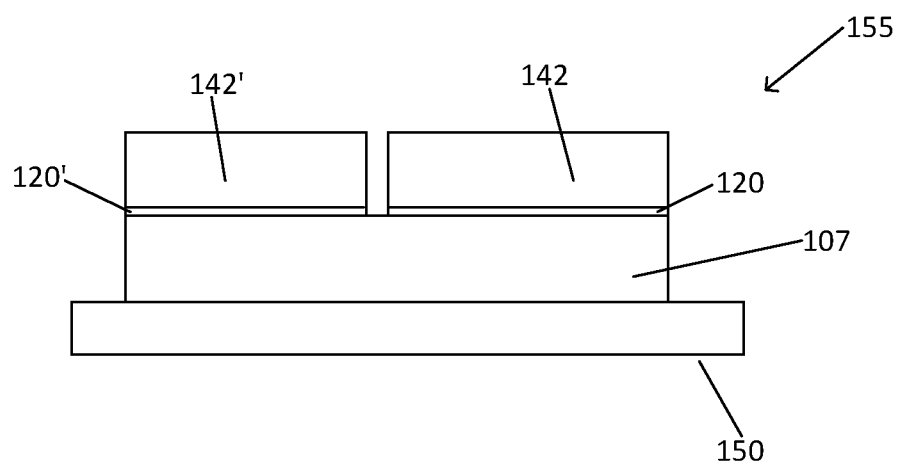

In FIG. 1J, a perspective view of a package structure 155 is depicted, according to an embodiment. A first die 142 and a second die 142' are on a second side 158 of a composite dielectric layer 107, and are physically and electrically coupled by interconnect structures (not shown) within the composite dielectric layer 107. A first side 156 of the composite dielectric layer 107 is physically and electrically coupled by interconnect structures (not shown) within the composite dielectric layer 107 to a package substrate 150. The first and second die 142, 142' may comprise die bonding layers 120, 120', wherein the die bonding layers 120, 120' are on the second side 158 of the composite dielectric layer 107 (FIG. 1K, cross-sectional view). The die bonding layers 120, 120' may include any of the embodiments of the die bonding layers 120 described herein. The dielectric layers of the die bonding layer 120 may be covalently bonded to the inorganic filler material (not shown) of the composite dielectric layer 107. The conductive interconnect structures of the die and the composite dielectric layer 107 (not shown) are bonded together with dielectric and metal bonding, as shown on FIG. 1B, for example.

Figure 2A:
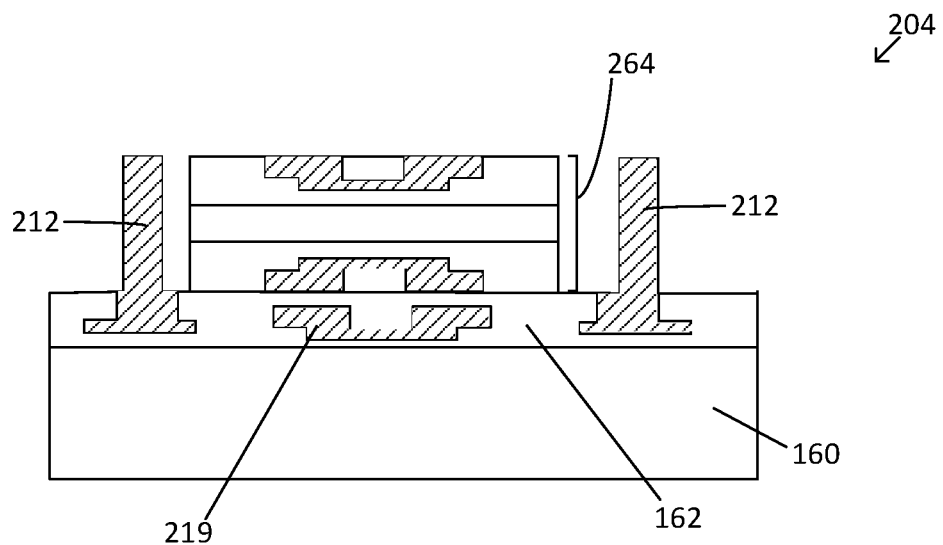
FIGS. 2A-2G illustrate cross-sectional views of methods of fabricating package structures having mixed hybrid bonding structures, according to embodiments.

FIGS. 2A-2E depict cross-sectional views of a method of forming mixed hybrid bonding package structures according to embodiments. In FIG. 2A, a portion of a package structure 204 is shown. A build up substrate 162, such as a damascene build up or a redistribution layer, for example, may be on a carrier/handle 160, such as a silicon carrier, or any other suitable carrier material. The build up substrate 162 may comprise conductive and dielectric materials, which may be patterned according to a particular application, in some embodiments. For example, the build up substrate 162 may include conductive interconnect structures/routing layers 219 that are within dielectric layer(s), which may be configured to route electrical signals between any number of dice, in some embodiments.

For example, interconnect structures may include routing structures such as pads or traces configured to receive electrical signals to and from devices. In some embodiments, conductive interconnect structures/routing layers comprise trenches, ground planes, power planes, re-distribution layers (RDLs), and/or any other appropriate electrical routing features. The build up substrate 162 may also provide structural support for discrete components and/or any other type of device. A die 264, may be on the build up substrate 162. The die 264 may comprise any suitable die such as a central processing unit. In some embodiments, the die 264, may include a processing system (either single core or multi-core). In some embodiments, the die 106 may be a microprocessor, a graphics processor, a signal processor, a network processor, a chipset, a memory device, or any type of passive device etc. In some embodiments, the die 264 may be a system-on-chip (SoC) having multiple functional units (e.g. one or more processing units, one or more graphics units, one or more communications units, one or more signal processing units, one or more security units, etc.). Adjacent to the die 264, and on the build up substrate 262, are one or more substrate conductive interconnect structures 212.

Figure 2B:
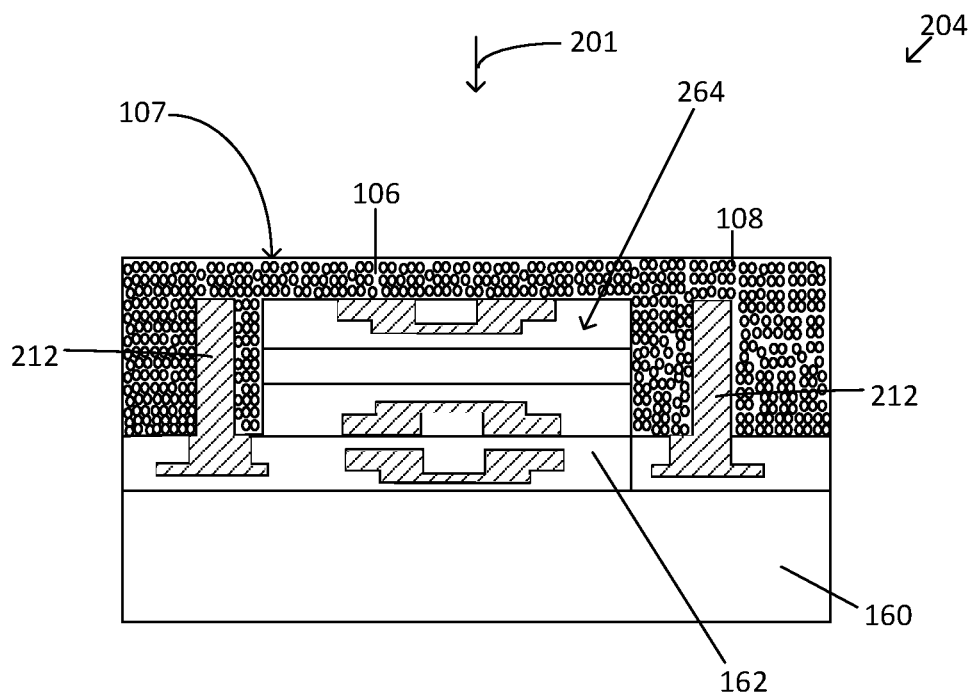

In FIG. 2B, a formation process 201, such as a composite dielectric material formation process 201, may be employed to form a composite dielectric layer 107, which comprises an organic dielectric material 106 filled with inorganic filler material, such as an inorganic filler material comprising silica materials, such as silica particles, low CTE dielectric fibers, dielectric particles, or platelets, silicon nitride, silicon dioxide, silicon carbide, silicon carbide nitride, aluminum oxide, diamond particles, or combinations thereof, for example. The CTE of the composite dielectric layer 107 is much less than the CTE of the conductive interconnect structures 212. The formation process 201 may include such formation techniques as CVD, PVD, ALD, spin on techniques, layer-by-layer deposition with laser pulsed annealing or thermal annealing, transfer or compression molding, or vacuum lamination, and may utilize such materials as mold compound materials, epoxy materials, silsesquioxane, spin on glass materials, which are filled with an inorganic filler material such as silica particles, for example. The composite dielectric layer 107 may comprise a thickness of about 5 to about 200 microns, and may comprise about 70 to about 95 percent by weight of the inorganic filler material 108. Individual particles of the inorganic filler material 108 may comprise a diameter of between about 0.002 microns to about 12 microns.

Figure 2C:
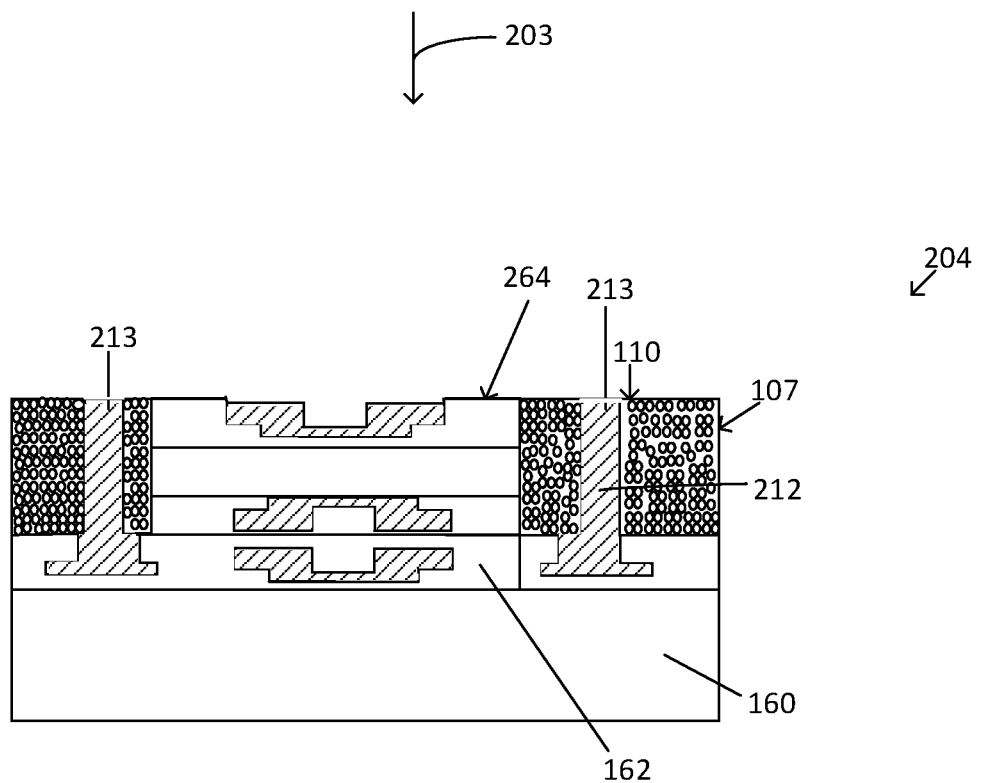

In FIG. 2C, a planarization process 203 may be performed on a top surface 110 of the composite dielectric layer 107, and on the top surface 213 of the substrate interconnect structures 212 as well as on the die 264. The planarization process 203 may comprise a chemical mechanical polishing (CMP) process, in an embodiment, where a topography of the surfaces of the die, composite dielectric layer 107, and the substrate interconnect structures 212 may be optimized for a particular application. For example, a smoothness of the surface 110 of the composite dielectric layer 107 and the inorganic dielectric layer of 264 may be tuned by varying such planarization parameters as slurry composition, rotation rate, pressure, and/or time, etc. In an embodiment, the amount of root-mean-square roughness of the composite dielectric layer 107 may be less than about 0.5 nm, but is dependent upon optimization of the planarization process 203. The amount of dishing recess of the surface 213 of the conductive interconnect structures 212 and interconnect structures on the die 264 may be tuned as well by varying the planarization process 203 parameters, such as the slurry chemistry, for example. Upon performing the planarization process 203, some of the inorganic filler material 108 at the surface of the composite dielectric layer 107 may be exposed, and the surfaces of the conductive substrate interconnect structures 212 may be exposed as well. The surfaces of the conductive substrate interconnect structures may be recessed slightly from the surface of the composite dielectric layer 107 and from the inorganic dielectric layer of the die 264.

Figure 2D:
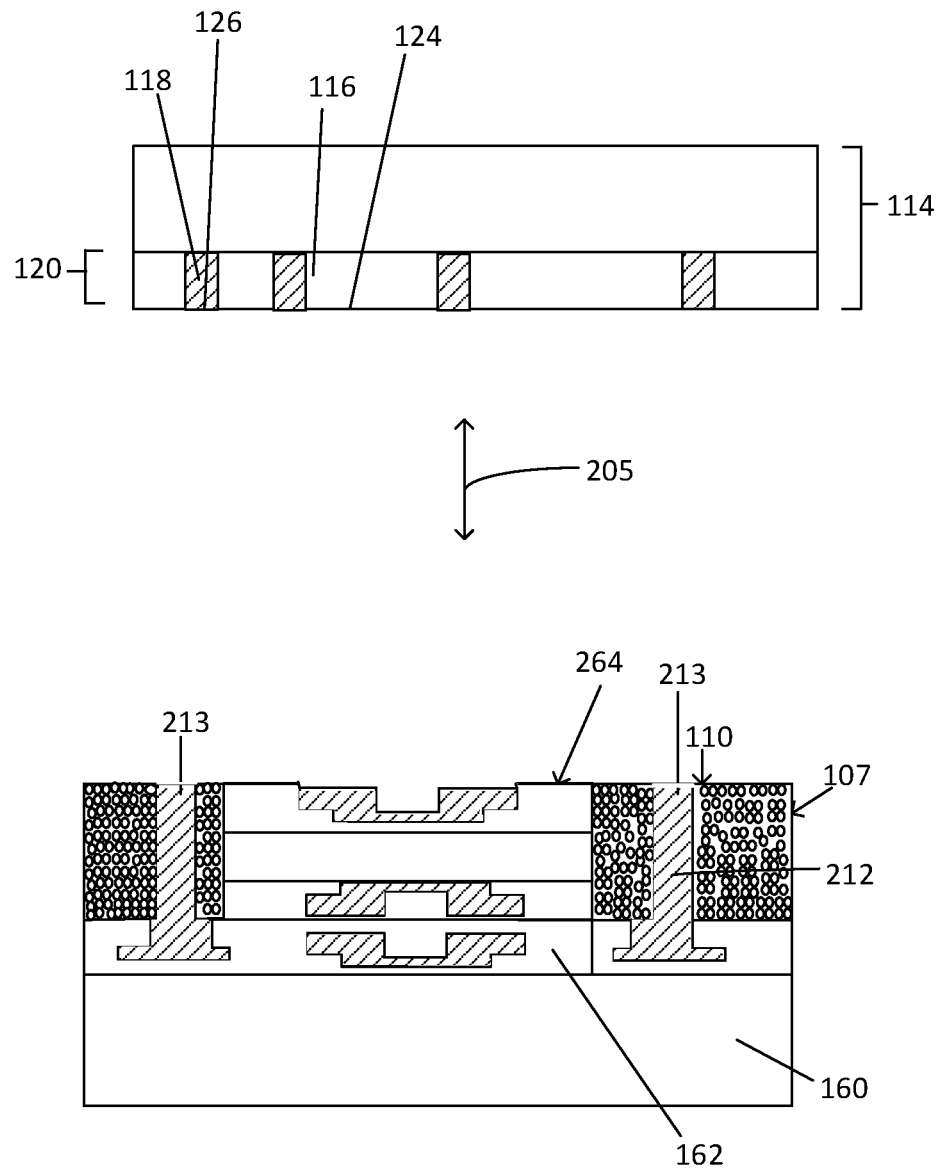

In FIG. 2D, a die attach process 205 may be employed to attach a die 114 to the portion of the substrate 204. The die 114 may comprise a die bonding layer 120, similar to the die bonding layer 120 of FIG. 1A, in an embodiment. The die bonding layer 120 may include a dielectric layer 116, which may be an inorganic dielectric layer, and one or more die interconnect structures 118. A top surface 126 of the conductive die interconnect structure 118 may be bonded, by metallic bonding, with a top surface 213 of the substrate conductive interconnect structure 212.

Figure 2E:
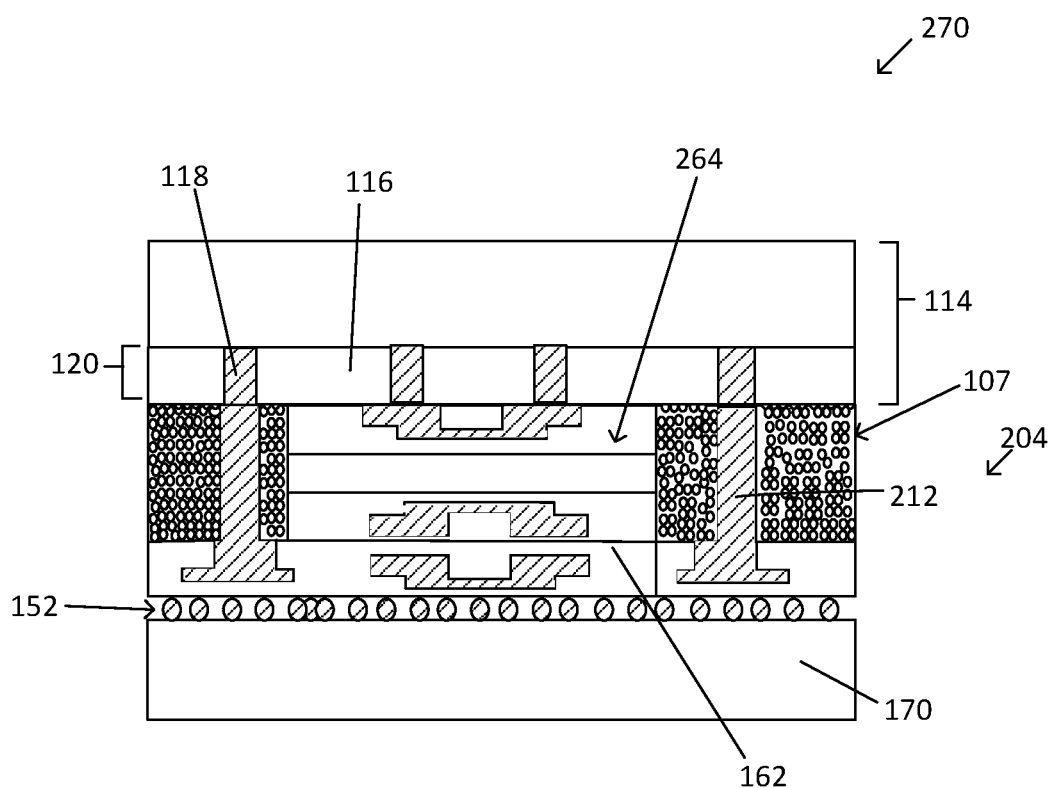

A top surface 110 of the composite dielectric layer 107 may be bonded with a top surface 124 of the dielectric material 116 of the die bonding layer 120. In an embodiment, the dielectric material 116 of the die bonding layer 120 and the inorganic filler material 108 of the composite dielectric layer 107 (and of the dielectric of die 264, in some embodiments) may form covalent bonds with each other initially, and then the conductive metal bonding of the die and conductive interconnect structures 118, 112 may occur during subsequently prescribed temperature processing. In this manner, by utilizing both inorganic covalent bonding within an organic dielectric and metal to metal bonding with which to bond the die 114 to the substrate 204, the use of solder and underfill material is not necessary, since the die attach process 205 is completed by the use of the mixed hybrid bonding processes disclosed herein. FIG. 2E depicts an embodiment of a portion of a package structure 270 wherein the carrier 160 has been removed, and a plurality of solder interconnect structures 152 are formed between a package substrate 170 and the conductive interconnects of the organic substrate 204.

Figure 2F:
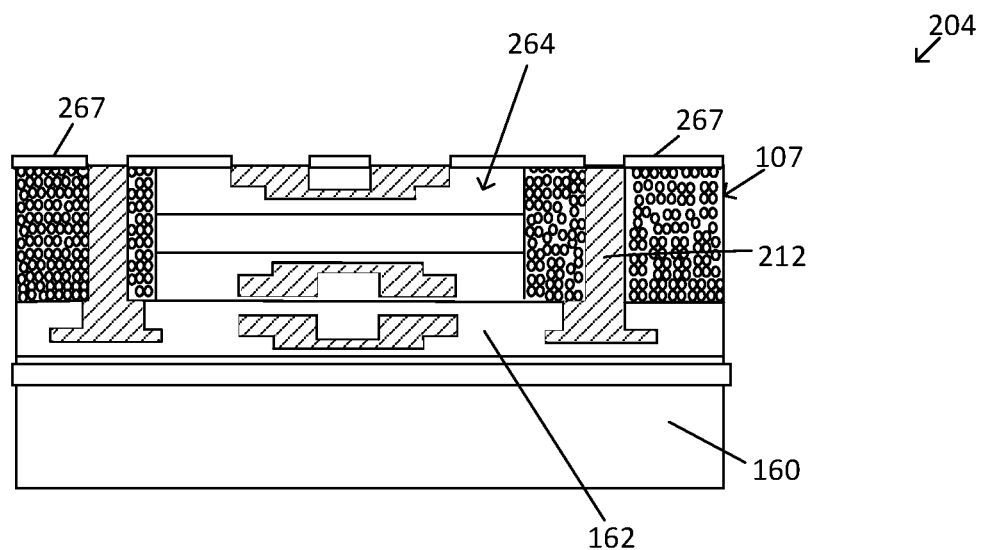
Figure 2G:
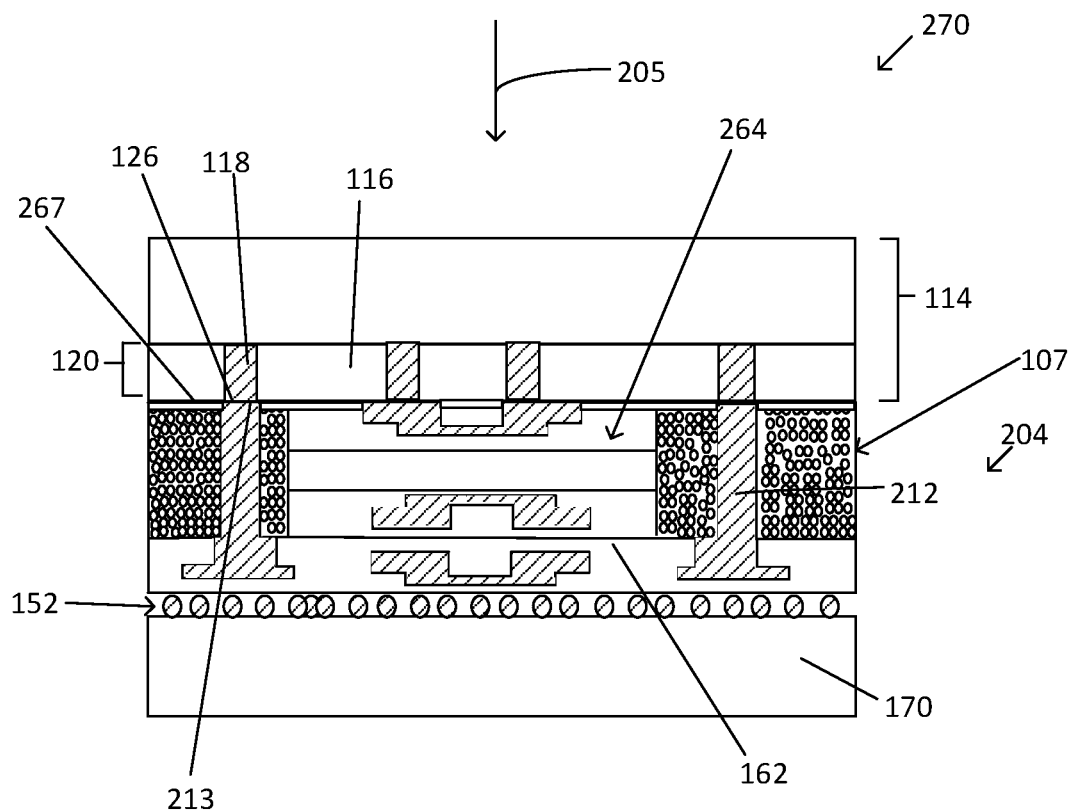

FIG. 2F depicts an embodiment wherein a coating layer 267 may be selectively formed on the composite dielectric layer 107, or where the coating layer 267 may be formed over the entire surface of the substrate 204, and then subsequently patterned and/or planarized. The coating layer 267 may comprise an inorganic material, such as an inorganic dielectric material, for example. The coating layer 267 may be formed at a temperature below the degradation temperature of the organic dielectric material 106 of the composite dielectric layer 107, or at a temperature surpassing the degradation temperature but for extremely short durations (such as micro-seconds) typical of a pulsed laser annealing process, for example The coating layer 267 may be formed by one or more of a PVD, an ALD, a CVD, or a spin on process, with or without a thermal anneal. Subsequent to formation of the coating layer 267, the coating layer 267 may be optionally pulse laser annealed. The coating layer 267 forms a bond with the composite dielectric layer 107. In FIG. 2G, a die attach process 205 may be employed to attach a die 114 to the portion of the substrate 204 and the die 264, including the coating layer 267 that spans the two features. The die 114 may comprise a die bonding layer 120, similar to the die bonding layer 120 of FIG. 1A, in an embodiment. The die bonding layer 120 may include a dielectric layer 116, which may be an inorganic dielectric layer, and one or more die interconnect structures 118. A top surface 126 of the conductive die interconnect structure 118 may be bonded, by metallic bonds, with a top surface 213 of the substrate conductive interconnect structure 212. The coating layer 267 may bond with the inorganic dielectric 116 of the die 114.

Figure 3A:
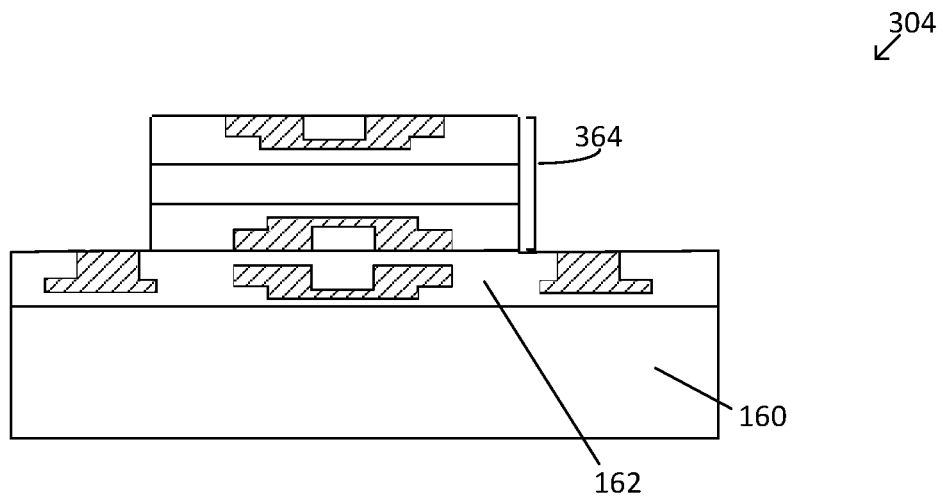
FIGS. 3A-3F illustrate cross-sectional views of methods of fabricating package structures having mixed hybrid bonding structures, according to embodiments.

FIGS. 3A-3F depict cross-sectional views of a method of forming hybrid bonding package structures according to embodiments. In FIG. 3A, a portion of a substrate structure 304 is shown. A build up substrate 162, such as a damascene build up or a redistribution layer (RDL) for example, may be on a carrier/handle 160, such as a silicon carrier, or any other suitable carrier material. The build up substrate 162 may comprise conductive and dielectric materials, which may be patterned according to design requirements of a particular application, in some embodiments. A die 364, may be on the build up substrate 162. The die 364 may comprise any suitable die such as a cpu, for example.

Figure 3B:
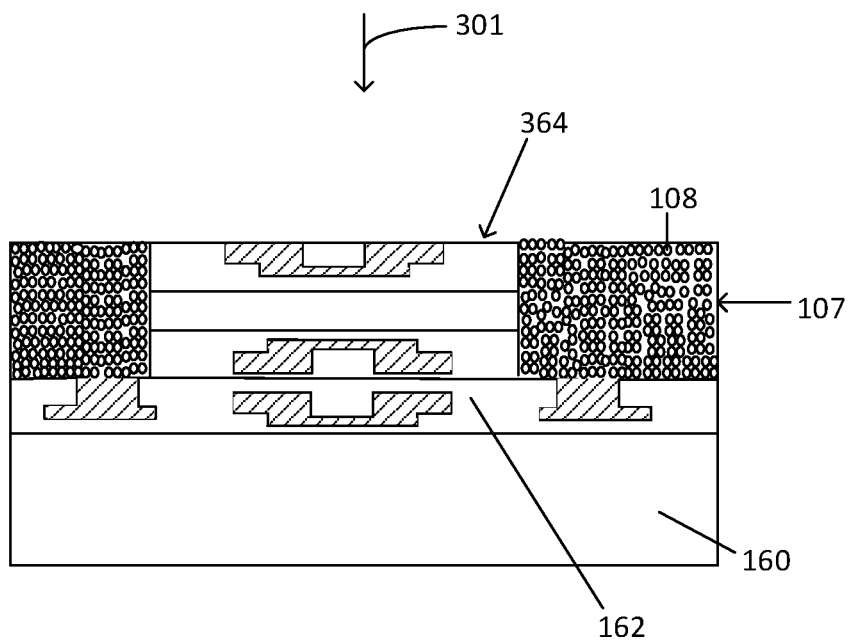

In FIG. 3B, a formation process 301, such as a composite dielectric material formation process 301, may be employed to form a composite dielectric layer 107, which comprises an organic dielectric material filled with inorganic filler material, such as an inorganic filler material 108 comprising silica particles, for example. The CTE of the composite dielectric layer 107 is much less than the CTE of conductive interconnect structures to be formed subsequently in the direction normal to the interface plane. The formation process 301 may include such formation techniques as CVD, PVD, ALD, spin on techniques, transfer or compression mold, and/or vacuum lamination, and may utilize such materials as mold compound materials, epoxy materials, silsesquioxane, spin on glass materials, which are filled with an inorganic filler material such as silica particles, for example.

Figure 3C:
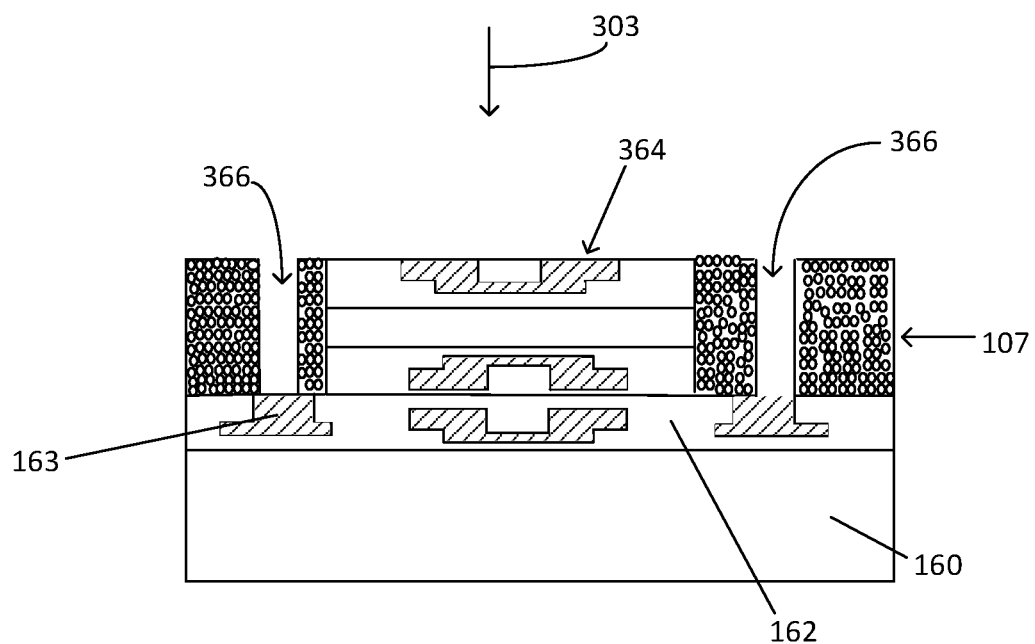
Figure 3D:
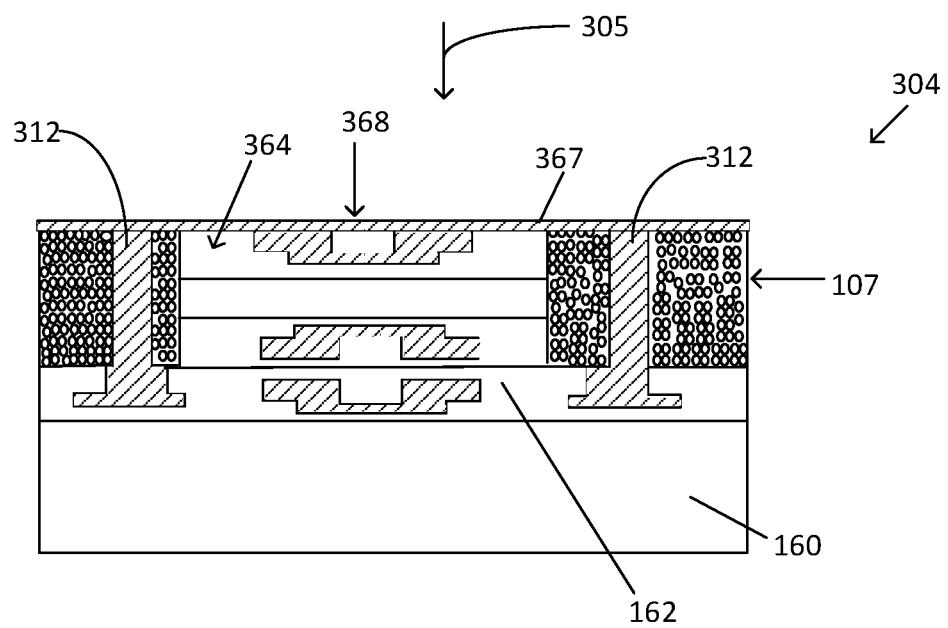

In FIG. 3C, a removal process 303, such as an etching process, for example, may be employed to remove a portion of the composite dielectric layer 107 to form one or more openings 366. The removal process 303 may expose one or more conductive traces 163 in the build up layer 162. In FIG.

3D, a metal formation process 305 may be employed. In an embodiment, a thin seed layer and optionally a barrier layer (not shown) may first be formed within the one or more openings 366. The seed layer and/or barrier layers may comprise any suitable conductive materials such as copper alloy materials, titanium, tantalum, tantalum nitride, or combinations thereof, for example, and may be formed by a sputtering process, a physical deposition process, or any other suitable formation process. The seed layer may comprise a thickness of 10 nm to 400 nm, in an embodiment, and may comprise a conductive metal such as a copper alloy. A subsequent electroplating process then fills the one or more openings 366 with a conductive material, such as copper, to form one or more substrate conductive interconnect structures 312. A portion of the conductive metal 367 may be over the top surface 368 of the portion of the substrate 304.

Figure 3E:
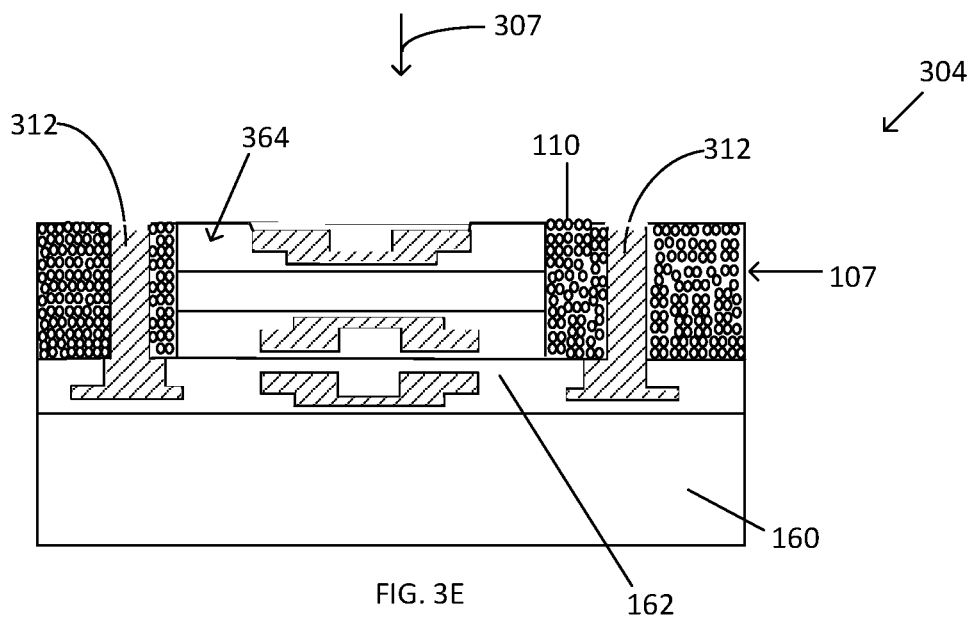

In FIG. 3E, a metal planarization process 307 may be performed on the top surface 368 of the conductive material 367, so that top surfaces of the conductive interconnect structures 312 and those of the die 264 may be slightly recessed from the top surface 110 of the composite dielectric layer 107 as well as slightly recessed from the top surface of the dielectric material of the die 264. The planarization process 307 may comprise a chemical mechanical polishing (CMP) process, in an embodiment, where a topography of the top surfaces 108 of the conductive interconnect structures and the composite dielectric layer 107 may be optimized for a particular application. For example, a smoothness of the surface 108 of the composite dielectric material may be tuned by varying such planarization parameters as slurry composition, rotation rate, time, etc.

In an embodiment, the amount of root-mean-square roughness of the composite dielectric layer 107 may be less than about 0.5 nm. Similarly, the amount of recess or dishing of the surface of the conductive interconnect structures 312 may be tuned as well by varying the planarization process 307 parameters, such as the slurry chemistry, for example. Upon performing the planarization process 307, some of the inorganic filler material 108 at the surface of the composite dielectric layer 107 may be exposed as well as the dielectric of the die 364, and the surfaces of the conductive substrate interconnect structures 312 may be exposed as well those on die 364. In some cases, the surfaces of the conductive substrate interconnect structures may be recessed slightly from the surface of the composite dielectric material.

Figure 3F:
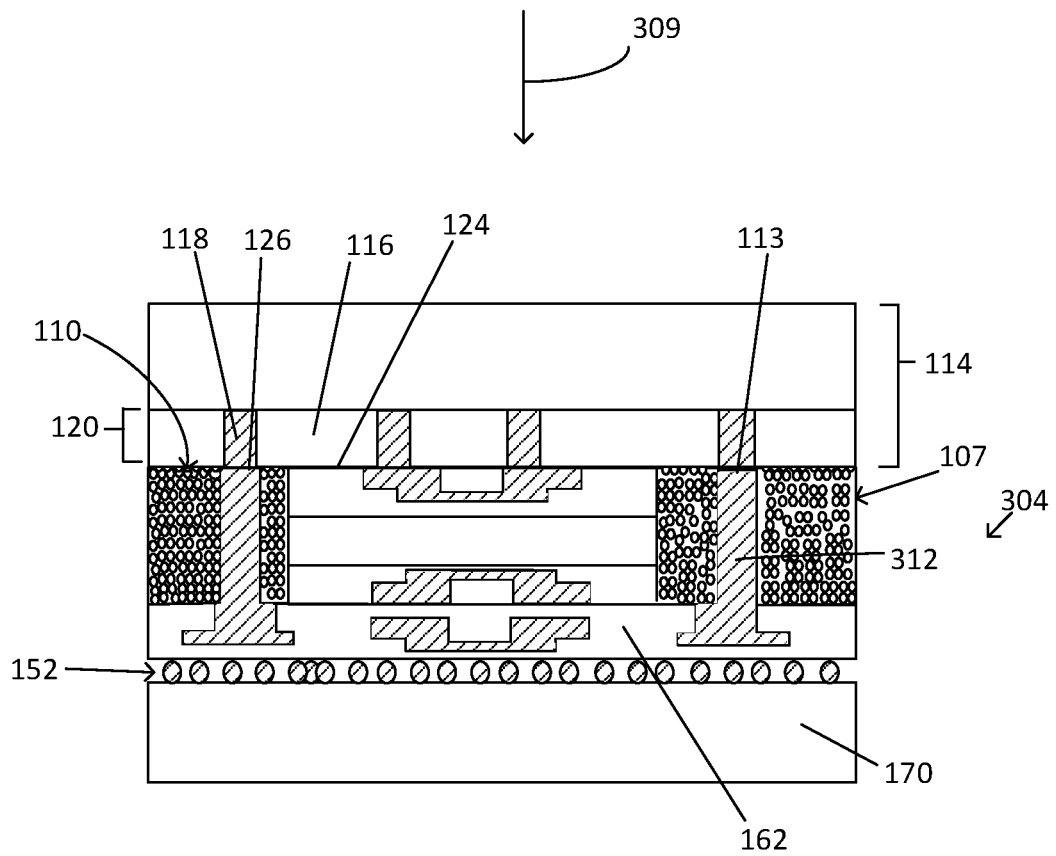

In FIG. 3F, a die attach process 309 may be employed to attach a die 114 to the portion of the substrate 204. The die 114 may comprise a die bonding layer 120, similar to the die bonding layer 120 of FIG. 1A, in an embodiment. The die bonding layer 120 may include a dielectric layer 116, which may be an inorganic dielectric layer, and one or more die interconnect structures 118. A top surface 126 of the conductive die interconnect structure 118 may be bonded, by metallic bonds, with a top surface 113 of the substrate conductive interconnect structure 312.

A top surface 110 of the composite dielectric material 106 and that of the die 364 may be bonded with a top surface 124 of the dielectric material 116 of the die bonding layer 120. In an embodiment, the dielectric material 116 of the die bonding layer and the inorganic filler material 108 of the composite dielectric layer 107 may form covalent bonds with each other. During subsequent temperature processing, metallic bonding between the conductive interconnects 118, 112 is formed. In this manner, by utilizing both an inorganic covalent bond and a metal to metal bond with which to bond the die 114 to the substrate 204 and die 364, the use of solder and underfill material is not necessary, since the die attach process is completed by the use of the hybrid bonding processes disclosed herein. In an embodiment, the carrier 160 has been removed and the organic substrate is attached to a package substrate, wherein a plurality of solder interconnect structures 152 is formed between the package substrate 170 and interconnect structures within the organic substrate 304.

Figure 4A:
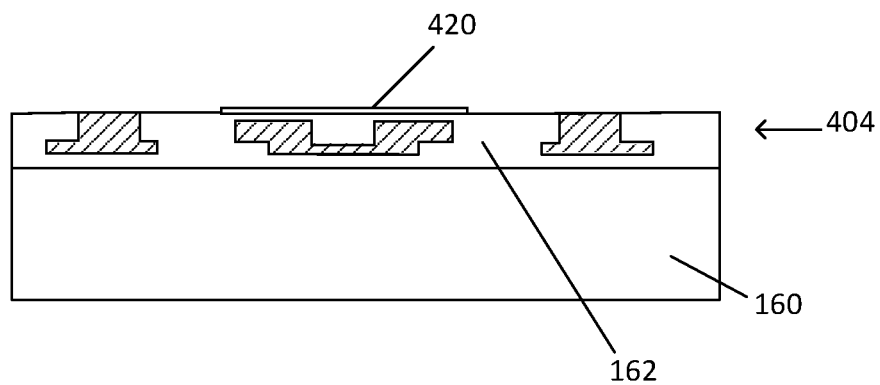
FIGS. 4A-4H illustrate cross-sectional views of methods of fabricating package structures having mixed hybrid bonding structures, according to embodiments.

FIGS. 4A-4H depict cross-sectional views of a method of forming hybrid bonding package structures according to an embodiment. In FIG. 4A, a portion of a substrate structure 404 is shown. A build up substrate 162, such as a damascene build up or an RDL for example, may be disposed on a carrier/handle 160, such as a silicon carrier, or any other suitable carrier material. The build up substrate 162 may comprise conductive and dielectric materials, which may be patterned according to design requirements of a particular application, in some embodiments. An etch stop layer 420 may be patterned selectively across the build up substrate 162.

Figure 4B:
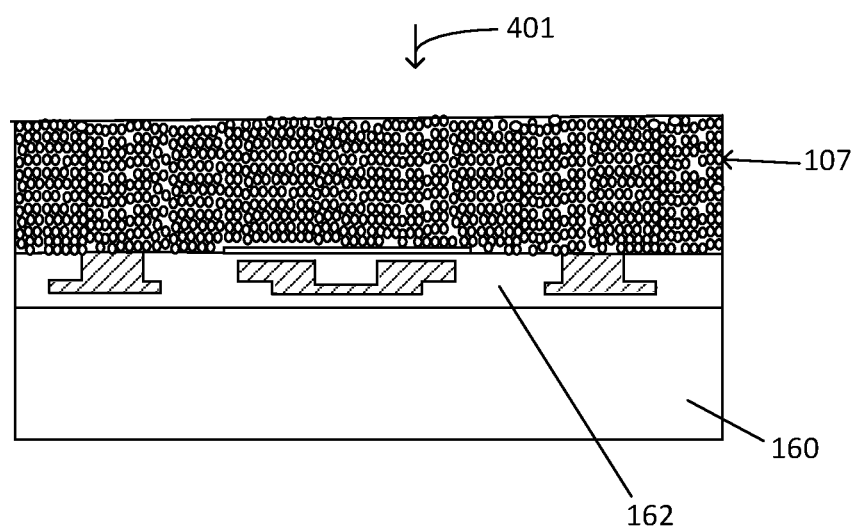

In FIG. 4B, a formation process 401, such as a composite dielectric material formation process 401, may be employed to form a composite dielectric layer 107 on the build up substrate 162. The composite dielectric layer 107 comprises an organic dielectric material filled with inorganic filler material, such as an inorganic filler material comprising silica particles, for example. The CTE of the composite dielectric layer 107 is much less than the CTE of conductive interconnect structures to be formed subsequently in the direction normal to the bonding interface plane. The formation process 301 may include such formation techniques as CVD, PVD, ALD, spin on techniques, transfer or compression mold, and/or vacuum lamination utilizing such materials as mold compound materials, epoxy materials, silsesquioxane, spin on glass materials build up materials or combinations thereof, which are filled with an inorganic filler material such as silica particles, for example.

Figure 4C:
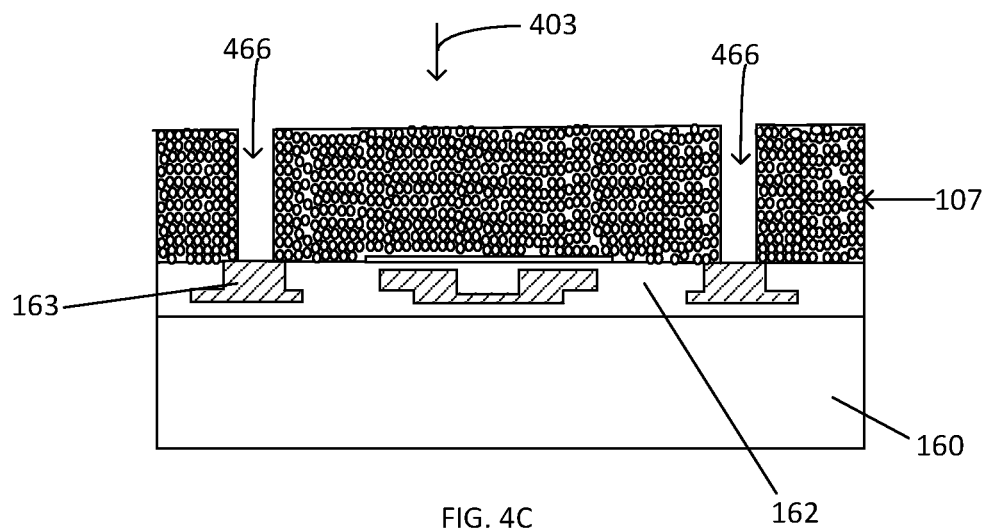
Figure 4D:
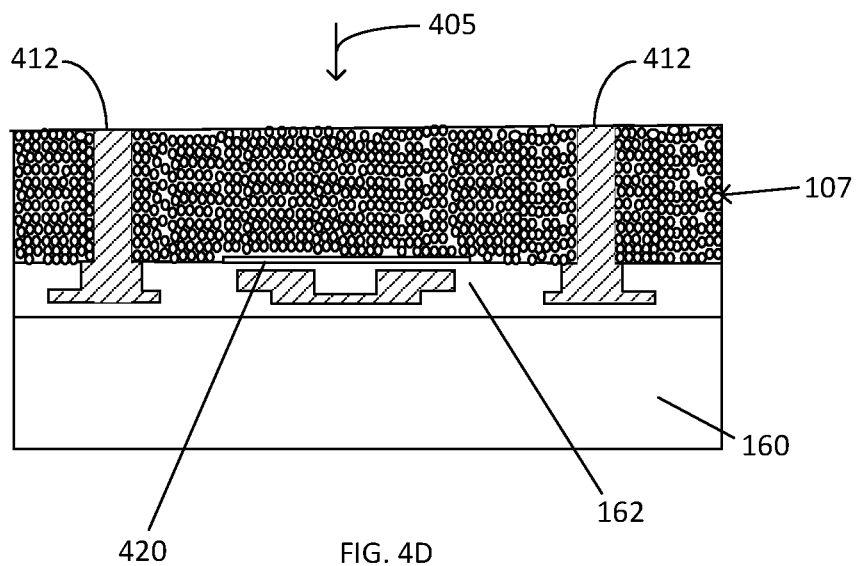

In FIG. 4C, a removal process 403, such as an etching process, for example, may be employed to remove a portion of the composite dielectric layer 107 to form one or more openings 466. The removal process 403 may expose one or more conductive traces or pads 163 in the build up layer 162. In FIG. 4D, a metal formation process 405 may be employed. In an embodiment, a thin seed layer and optionally a barrier layer (not shown) may first be formed within the one or more openings 466. The formation process 405 then fills the one or more openings 466 with a conductive material, such as copper or copper alloys, to form one or more substrate conductive interconnect structures 412 via electroplating, paste printing, cold spray or similar such processes.

Figure 4E:
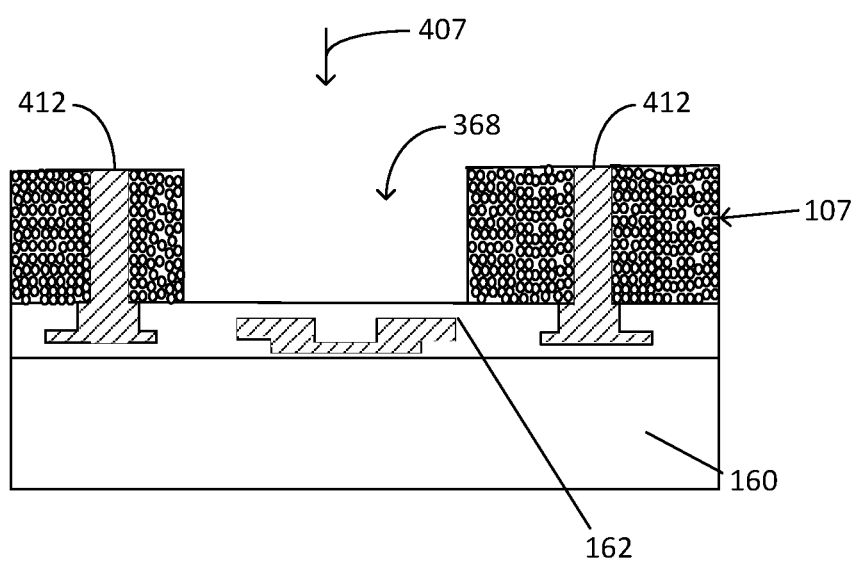
Figure 4F:
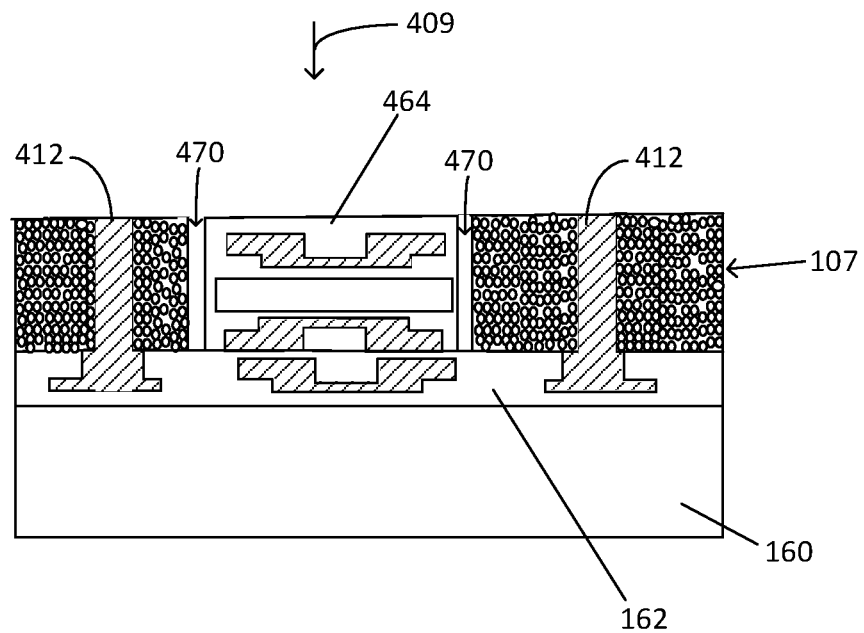
Figure 4G:
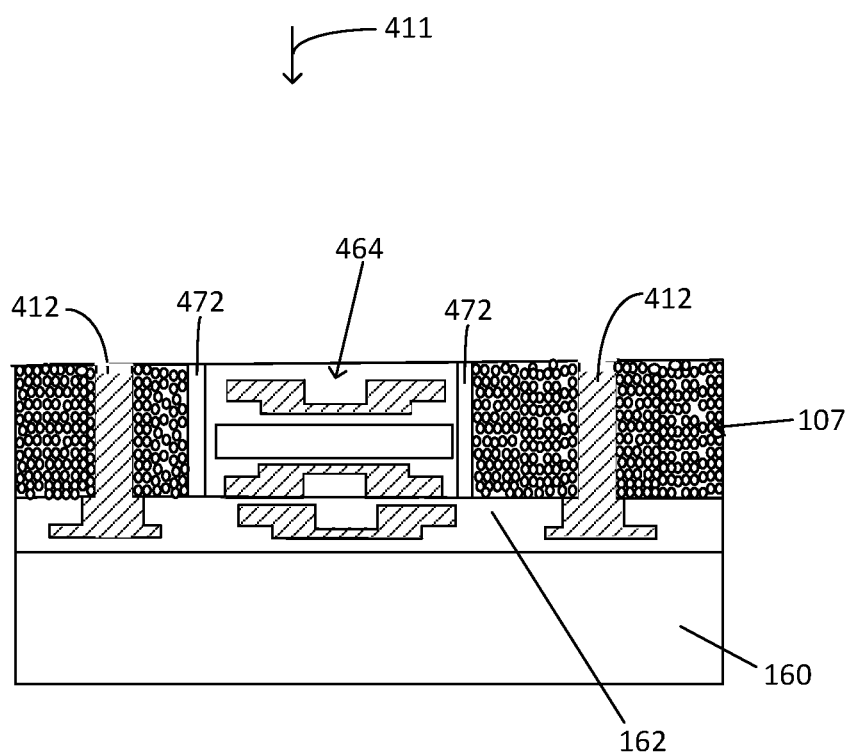
Figure 4H:
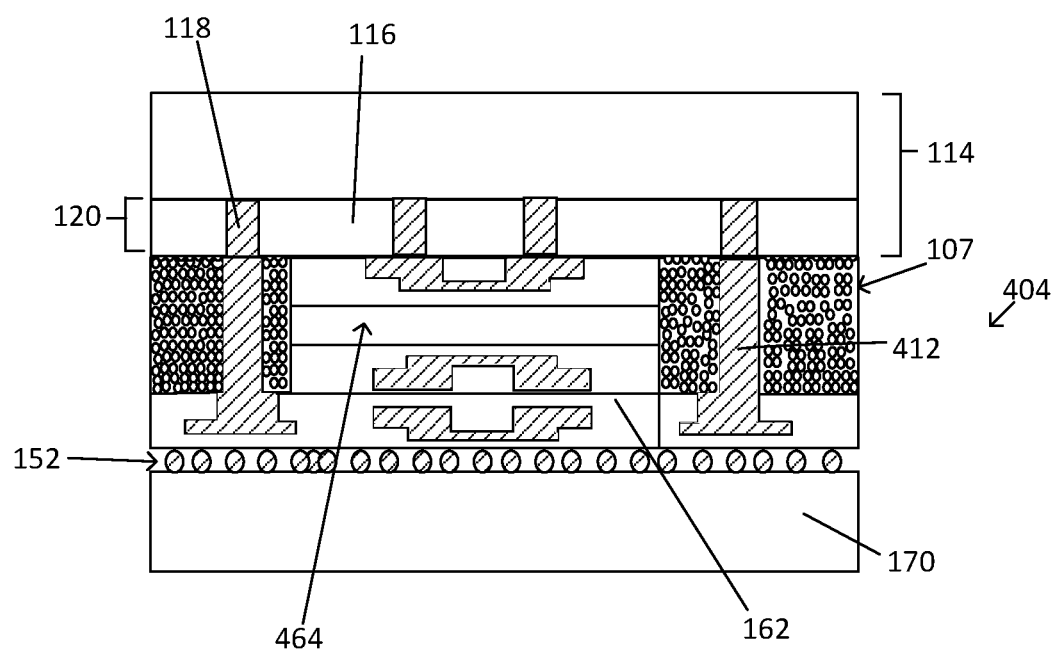

In FIG. 4E, a removal process 407, such as an etching process, for example, may be employed to remove a portion of the composite dielectric layer 107 to form an opening 368. The selective etch stop layer 420 may be utilized to prevent damage of the underlying dielectric surface. The selective etch stop may be removed during process 407 with an additional selective etch step, in an embodiment. In FIG. 4F, a die 464 may be attached, by utilizing process 409, to the build up substrate 162. A gap 470 may be adjacent the die 464. The gap 470 may be filled with a dielectric layer 472 (FIG. 4G), and a die 114 may be attached to the substrate 404 (FIG. 4H) after preparation of the top surface e.g. by chemical mechanical polish, depicted in FIG. 4G to meet particular design requirements. A die attach process may be employed to attach the die 114 to the portion of the substrate 404. The die 114 may comprise a die bonding layer 120, similar to the die bonding layer 120 of FIG. 1A, in an embodiment. The die bonding layer 120 may include a dielectric layer 116, which may be an inorganic dielectric layer, and one or more die interconnect structures 118. A surface of the one or more conductive die interconnect structures 118 may be bonded, by metallic bonds, with a surface of the substrate conductive interconnect structure 412 including those of die 464.

A top surface of the composite dielectric material 106 and the dielectric surface of 464 may be bonded with a top surface of the dielectric material 116 of the die bonding layer 120. In an embodiment, the dielectric material 116 of the die bonding layer and the inorganic filler material 108 of the composite dielectric material 106 as well as the dielectric of the die 464 may form covalent bonds with each other, and during subsequent temperature processing the bonding between conductive interconnects 412, 118 are formed. In this manner, by utilizing both an inorganic covalent bond and a metal to metal bond with which to bond the die 114 to the substrate 204, the use of solder and underfill material is not necessary, since the die attach process is completed by the use of the hybrid bonding processes disclosed herein. In an embodiment, the carrier 160 has been removed and the organic substrate 404 is attached to a package substrate 170, wherein a plurality of solder interconnect structures 152 are formed between the package substrate 170 and the conductive features of the organic substrate 404.

Figure 5:
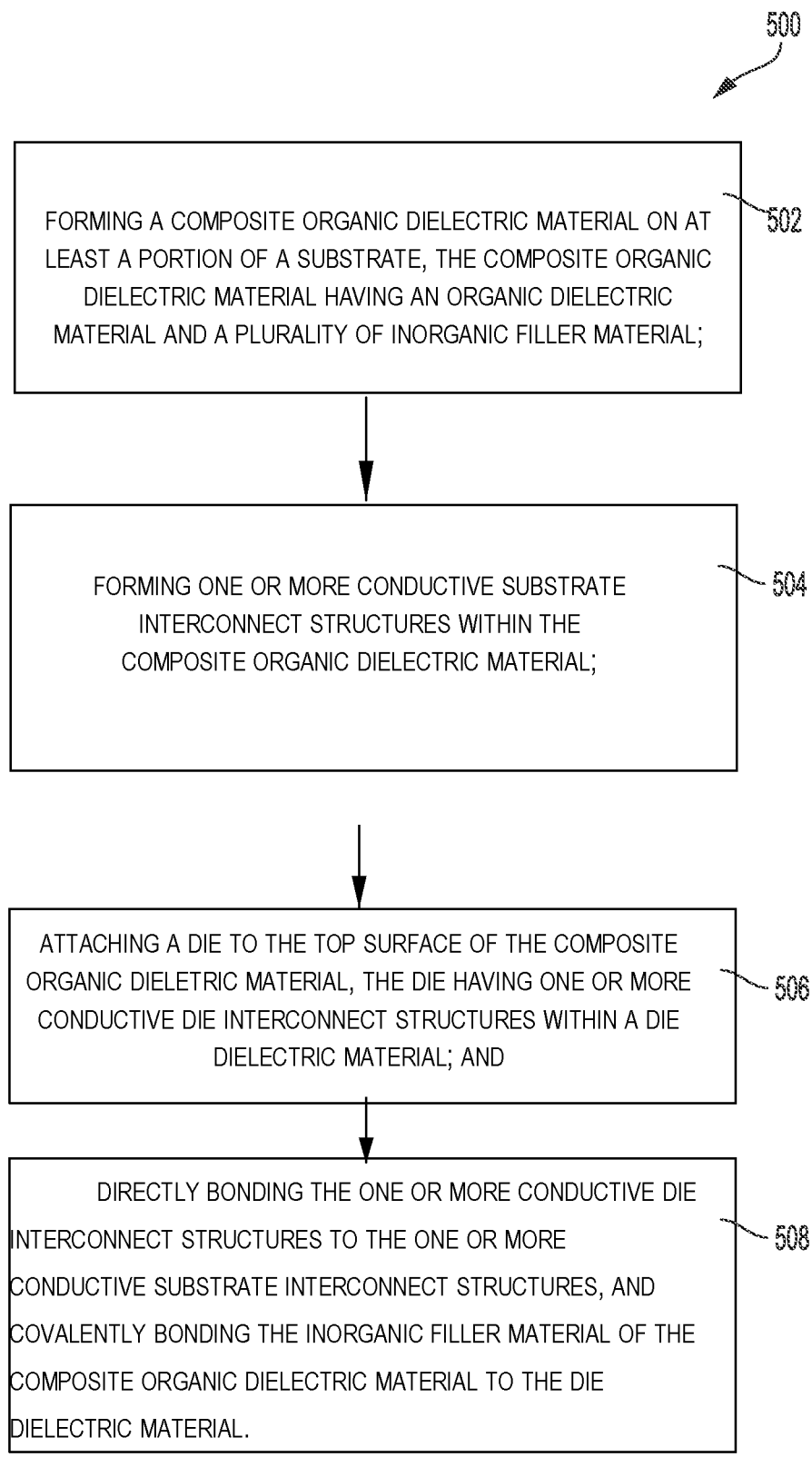
FIG. 5 illustrates a flow chart of methods of fabricating mixed hybrid bonding structures, according to embodiments.

FIG. 5 depicts a flow chart of an embodiment of a method 500 of forming mixed hybrid bonding structures, as disclosed herein. The mixed hybrid bonding structures described in the embodiment enable higher density interconnects, with finer pitch assembly. The need for solder is eliminated, and removal of underfill or mold around solder is alleviated as well. Less warpage is achieved, and the need for solder plating and lithography is eliminated. Power delivery and reliability is improved with the removal of solder from systems incorporating the embodiments described in the present application. The method 500 may share any or all characteristics with any other methods discussed herein, such as, but not limited to, the methods disclosed in FIGS. 2A-2G, 3A-3F, and 4A-4H, for example, which may show cross-sectional views of structures employing any of the operations described in method 500. It should be noted that the order of the operations of method 500 may be varied, according to a particular application.

At operation 502, a composite dielectric material may be formed on at least a portion of a substrate, wherein the composite dielectric material comprises an organic dielectric material and is filled with a plurality of inorganic filler material. In an embodiment, the composite dielectric material may be formed on the substrate using any suitable formation process, such as has been described in the embodiments herein. The plurality of inorganic filler material may be added to a suitable organic dielectric material, such as has been described in the embodiments, in order to reduce the overall CTE of an organic substrate in the direction normal to the bonding interface plane relative to the CTE of the metal interconnects.

At operation 504, one or more conductive substrate interconnect structures may be formed within the composite dielectric material. In an embodiment, top surfaces of the one or more conductive substrate interconnect structures may be slightly recessed with a top surface of the composite dielectric material. In other embodiments, the top surfaces of the one or more conductive substrate interconnect structures may be dished or slightly recessed from the surface of the composite dielectric material, depending upon design requirements. Surface topography of the composite dielectric material and conductive structures can be tuned with a CMP process, for example and typically the root-mean-square roughness of the dielectric must be less than 0.5 nm.

At operation 506, a die may be attached to the top surface of the composite dielectric material, wherein the die may comprise one or more conductive die interconnect structures within a die dielectric material. The die dielectric material may comprise an inorganic material, or may comprise a composite dielectric material having an organic dielectric material filled with inorganic filler particles.

At operation 508, the one or more conductive die interconnect structures are directly bonded to the one or more conductive substrate interconnect structures by metal to metal bonds. The composite dielectric material of the substrate is covalently bonded with the die, as described herein.

Figure 6:
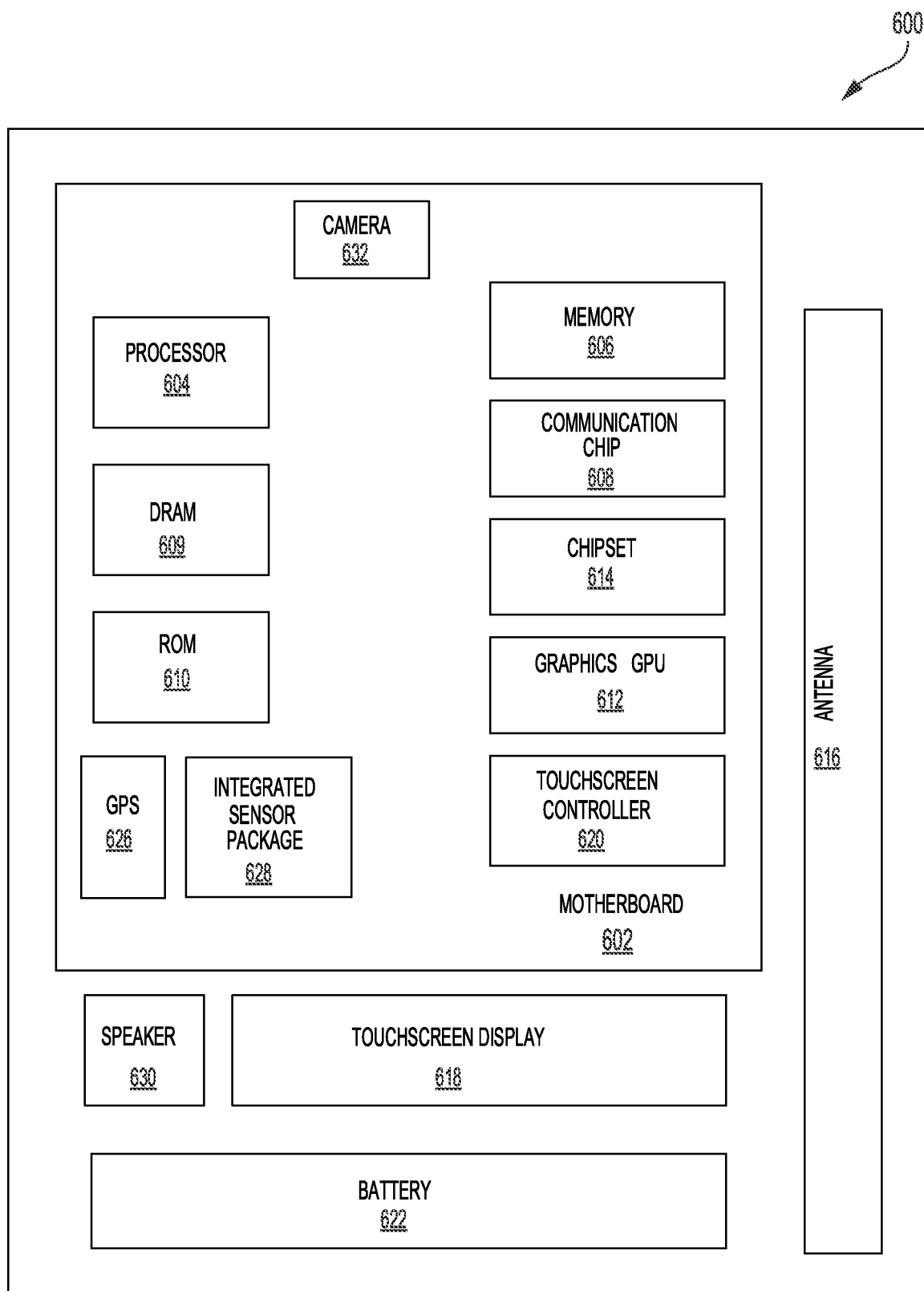
FIG. 6 is a functional block diagram of a computing device having hybrid bonding structures according to embodiments.

FIG. 6 is a schematic of a computing device 600 that may be implemented incorporating the package structures described in any of the embodiments herein comprising mixed hybrid bonding structures. The mixed hybrid bonding structures of the packaged devices herein provide a smaller pitch and absence of solder and underfill materials, such as the mixed hybrid bonding structure depicted in FIG. 1A, for example. In an embodiment, the computing device 600 houses a board 602, such as a motherboard 602 for example. The board 602 may include a number of components, including but not limited to a processor 604, an on-die memory 606, and at least one communication chip 608. The processor 604 may be physically and electrically coupled to the board 602. In some implementations the at least one communication chip 608 may be physically and electrically coupled to the board 602. In further implementations, the communication chip 608 is part of the processor 604.

Depending on its applications, computing device 600 may include other components that may or may not be physically and electrically coupled to the board 602, and may or may not be communicatively coupled to each other. These other components include, but are not limited to, volatile memory (e.g., DRAM) 609, non-volatile memory (e.g., ROM) 610, flash memory (not shown), a graphics processor unit (GPU) 612, a chipset 614, an antenna 616, a display 618 such as a touchscreen display, a touchscreen controller 620, a battery 622, an audio codec (not shown), a video codec (not shown), a global positioning system (GPS) device 626, an integrated sensor 628, a speaker 630, a camera 632, an amplifier (not shown), compact disk (CD) (not shown), digital versatile disk (DVD) (not shown), and so forth). These components may be connected to the system board 602, mounted to the system board, or combined with any of the other components.

The communication chip 608 enables wireless and/or wired communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 600 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

What is claimed is:

1. A microelectronic structure comprising:
   a substrate bonding layer comprising:
     a composite dielectric layer comprising an organic dielectric material and an inorganic filler material; and
     one or more conductive substrate interconnect structures within the composite organic dielectric layer; and
   a die comprising a die bonding layer, the die bonding layer comprising:
     a die dielectric layer; and
     one or more conductive die interconnect structures within the die dielectric layer, wherein the die bonding layer is in direct contact with the substrate bonding layer, and wherein at least one of the one or more conductive substrate interconnect structures is in direct contact with at least one of the one or more conductive die interconnect structures.

2. The microelectronic structure of claim 1 wherein at least one of the conductive die or the conductive substrate interconnect structures has a coefficient of thermal expansion (CTE), in a direction normal to a bonding interface between the substrate bonding layer and the die bonding layer that is at least 30 percent greater than a CTE of the composite organic dielectric layer.

3. The microelectronic structure of claim 1 further comprising a coating layer in direct contact with the composite dielectric layer and in direct contact with the die dielectric layer.

4. The microelectronic structure of claim 3 wherein the coating layer has a thickness between 10 nm and 1600 nm.

5. The microelectronic structure of claim 1 wherein the organic dielectric material comprises one or more of an epoxy material or a spin on glass material, and wherein the inorganic filler material comprises one or more of silica, a silsesquioxane material, silicon nitride, silicon carbide, aluminum oxide, or diamond, and wherein the organic dielectric material comprises between about 70% by weight to about 95% by weight of the inorganic filler material.

6. The microelectronic structure of claim 5, wherein the die dielectric layer comprises an inorganic dielectric material.

7. The microelectronic structure of claim 1 wherein at least a portion of the inorganic filler material is covalently bonded with the inorganic dielectric layer of the die bonding layer.

8. The microelectronic structure of claim 1 wherein the one or more conductive die interconnect structures include a first conductive die interconnect structure adjacent to a second conductive die interconnect structure, wherein a pitch between the first conductive die interconnect structure and the second conductive die interconnect structure is less than 50 microns.

9. The microelectronic structure of claim 1 wherein a top surface of the substrate bonding layer, a top surface of the die bonding layer, and top surfaces of the one or more conductive die interconnect structures and the one or more conductive die interconnect structures are free of solder, and are free of underfill material.

10. A microelectronic structure comprising:
    a package substrate;
    a dielectric layer on the package substrate, wherein at least a portion of the dielectric layer comprises an inorganic filler material within an organic dielectric material;
    one or more conductive substrate interconnect structures within the organic dielectric layer;
    a die comprising a die bonding layer, the die bonding layer comprising:
      a die dielectric layer; and
      one or more conductive die interconnect structures within the die dielectric layer, wherein the die bonding layer is directly on the dielectric layer, wherein the one or more conductive substrate interconnect structures are directly on the one or more conductive die interconnect structures.

11. The microelectronic structure of claim 10 wherein the die dielectric layer comprises a die organic dielectric material, wherein an inorganic filler material is within the die organic dielectric material, and wherein the dielectric layer comprises an organic dielectric material, wherein an inorganic filler material is within the organic dielectric material.

12. The microelectronic structure of claim 10 wherein the dielectric layer comprise a first portion comprising an organic dielectric material, wherein an inorganic filler material is within the first portion of the organic dielectric material, and a second portion comprising an inorganic dielectric material that is free of an inorganic filler material, wherein the second portion is covalently bonded to the die dielectric layer, and wherein the inorganic filler material of the first portion is covalently bonded to the die dielectric layer.

13. The microelectronic structure of claim 12 wherein the first portion comprises between 70 percent by weight and 95 percent by weight of the inorganic filler material.

14. The microelectronic structure of claim 10 wherein the one or more conductive substrate interconnect structures and the one or more conductive die interconnect structures are free of a seed layer at an interface plane.

15. The microelectronic structure of claim 10 wherein the microelectronic structure is communicatively coupled to one or more of a central processing unit, a field-programmable gate array, a system on a chip, or a graphics processing unit, or a combination thereof.

* * * * *